US012681537B2

(12) United States Patent
Chae et al.

(10) Patent No.: US 12,681,537 B2
(45) Date of Patent: Jul. 14, 2026

(54) DISPLAY APPARATUS, METHOD OF MANUFACTURING THE DISPLAY APPARATUS, AND ELECTRONIC APPARATUS

(71) Applicant: Samsung Display Co., Ltd., Yongin-Si (KR)

(72) Inventors: Kyunghoon Chae, Yongin-si (KR); Soyeon Joo, Yongin-si (KR); Daehyun Hwang, Yongin-si (KR); Minhee Park, Yongin-si (KR); Daewoo Lee, Yongin-si (KR); Hyeondeuk Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 376 days.

(21) Appl. No.: 18/211,291

(22) Filed: Jun. 19, 2023

(65) Prior Publication Data

US 2024/0152184 A1 May 9, 2024

(30) Foreign Application Priority Data

Nov. 3, 2022 (KR) ......................... 10-2022-0145564

(51) Int. Cl.
*G06F 1/16* (2006.01)
*H05K 5/02* (2006.01)
(52) U.S. Cl.
CPC ......... *G06F 1/1652* (2013.01); *H05K 5/0217* (2013.01)
(58) Field of Classification Search
CPC ............................ H05K 5/0217; G06F 1/1652
See application file for complete search history.

(56) References Cited

U.S. PATENT DOCUMENTS

| | | | | |
|---|---|---|---|---|
| 9,769,920 B2 | 9/2017 | Ely et al. | | |
| 10,224,498 B2 | 3/2019 | Um et al. | | |
| 10,254,799 B2 | 4/2019 | Nishikawa | | |
| 10,637,007 B1 | 4/2020 | Wang et al. | | |
| 11,800,649 B2 * | 10/2023 | Burke | ..................... | G06F 1/163 |
| 11,889,647 B2 * | 1/2024 | Ahmed | ................. | G06F 1/1637 |
| 12,079,036 B2 * | 9/2024 | Barrett | ................. | G04G 17/045 |
| 12,213,260 B2 * | 1/2025 | Pandya | ................. | H05K 5/0217 |
| 2018/0081481 A1 * | 3/2018 | Fournier | ................ | H05K 1/148 |
| 2020/0092407 A1 * | 3/2020 | Fournier | ................ | G06F 1/1637 |
| 2021/0405688 A1 * | 12/2021 | Barrett | .................... | G09F 9/301 |
| 2022/0312607 A1 * | 9/2022 | Bass | ..................... | G06F 1/1686 |
| 2024/0081003 A1 * | 3/2024 | Wang | .................. | H05K 5/0217 |

FOREIGN PATENT DOCUMENTS

| | | |
|---|---|---|
| JP | 6831710 B2 | 2/2021 |
| KR | 10-2019-0037600 A | 4/2019 |
| KR | 10-2022-0000368 A | 1/2022 |

* cited by examiner

*Primary Examiner* — Sagar Shrestha
(74) *Attorney, Agent, or Firm* — Innovation Counsel LLP

(57) ABSTRACT

A display apparatus, a method of manufacturing the display apparatus, and an electronic apparatus are disclosed. The display apparatus includes a display panel including a display area and a peripheral area surrounding the display area, wherein the peripheral area includes a bent area extending from one side of the display area, a receiver receiving at least a portion of the display panel, and a filler disposed to fill a space between at least a portion of the display panel and the receiver, wherein the filler includes a coupler having a shape that may be coupled to the receiver.

16 Claims, 16 Drawing Sheets

DISPLAY APPARATUS, METHOD OF MANUFACTURING THE DISPLAY APPARATUS, AND ELECTRONIC APPARATUS

CROSS-REFERENCE TO RELATED APPLICATION

This application is based on and claims priority under 35 U.S.C. § 119 to Korean Patent Application No. 10-2022-0145564, filed on Nov. 3, 2022, in the Korean Intellectual Property Office, the disclosure of which is incorporated by reference herein in its entirety.

BACKGROUND

1. Field

The present disclosure relates to a display apparatus, a method of manufacturing the display apparatus, and an electronic apparatus, and more particularly, to a display apparatus with a bent area having reinforced strength, a method of manufacturing the display apparatus, and an electronic apparatus.

2. Description of the Related Art

Electronic apparatuses have become widely used. Electronic apparatuses are variously used as mobile electronic apparatuses and fixed electronic apparatuses. To support various functions, many electronic apparatuses include a display apparatus which may provide visual information such as images to users.

Recently, as the parts driving a display apparatus have been miniaturized, the proportion of the display apparatus in an electronic apparatus has been gradually increased and a structure that may be bent with respect to a flat or folded state have become common.

Generally, a display apparatus includes a display panel, and the display panel includes a display area in which images are displayed and a peripheral area which is a non-display area adjacent to the display area. Regarding the display panel, visibility at various angles may be improved or the area of the non-display area may be reduced by bending at least a portion of the peripheral area.

SUMMARY

One or more embodiments may include a display apparatus with a region having reinforced strength, in which at least a portion of the region is bent in the display panel, a method of manufacturing the display apparatus, and an electronic apparatus.

Additional aspects will be set forth in part in the description which follows and, in part, will be apparent from the description, or may be learned by practice of the presented embodiments of the disclosure.

An embodiment of a display apparatus includes a display panel including a display area and a peripheral area surrounding the display area, wherein the peripheral area includes a bent area extending from one side of the display area, a receiver receiving at least a portion of the display panel, and a filler disposed to fill a space between at least a portion of the display panel and the receiver, wherein the filler includes a coupler having a shape that may be coupled to the receiver.

The display panel may be bent in the bent area such that lower surfaces thereof face each other, and the filler may be disposed to fill a space between the lower surfaces facing each other, and a space between the bent area and the receiver.

The display apparatus may further include a cover window covering the display panel, wherein the receiver may be connected to a circumference of the cover window.

The filler may have a slope toward a center of the display panel in a direction from the cover window to a lower surface of the receiver.

The slope of the filler may have an angle of about 10 to about 2°.

The filler may be arranged along the circumference of the cover window.

The display apparatus may further include an optical functional layer disposed between the display panel and the cover window, wherein the filler may cover a lateral surface of the optical functional layer.

The coupler may have a stair-type step difference, and the receiver may be coupled to the step difference of the coupler.

The coupler may include a coupling protrusion protruding toward the receiver, and the receiver may include a receiving concave portion coupled to the coupling protrusion.

The coupling protrusion may protrude in an 'L' shape.

The coupling protrusion may be provided in plurality, and the plurality of coupling protrusions may be arranged apart from each other in an extension direction of the receiver.

The receiver may include a receiving protrusion protruding toward the filler, and the coupler may include a coupling concave portion coupled to the receiving protrusion.

The display apparatus may further include a cover window covering the display panel, wherein the receiving protrusion may protrude between the cover window and the filler.

According to one or more embodiments, a method of manufacturing a display apparatus includes preparing a display panel including a display area and a peripheral area, wherein the peripheral area surrounds the display area and includes a bent area extending from one side of the display area, disposing a cover window on the display panel, disposing a receiver along a circumference of the display panel, and forming a filler by filling an inner space between the receiver and the display panel with resin.

The forming of the filler may include filling a space between lower surfaces of the display panel facing each other, and a space between the bent area and the receiver with the resin.

The receiver may include a receiving concave portion that is concave in a thickness direction, and the method may further include forming coupling by filling the receiving concave portion with the resin.

The receiving concave portion may be concave in an 'L' shape.

An embodiment of a method of manufacturing a display apparatus includes preparing a display panel including a display area and a peripheral area, wherein the peripheral area surrounds the display area and includes a bent area extending from one side thereof, disposing a cover window on the display panel, disposing a mold frame along a circumference of the display panel, forming a filler by filling an inner space between the mold frame and the display panel with resin, removing the mold frame, and coupling a receiver to cover the filler.

The filler may include a coupling protrusion protruding toward the receiver, and the receiver may include a receiving concave portion coupled to the coupling protrusion.

The forming of the filler may include forming the filler to have a slope from the cover window to a center of the display panel in a vertical direction.

An embodiment of an electronic apparatus includes a display apparatus, and a housing receiving the display apparatus and forming an appearance of the electronic apparatus, wherein the display apparatus includes a display panel including a display area and a peripheral area surrounding the display area, wherein the peripheral area includes a bent area extending from one side of the display area, a receiver receiving at least a portion of the display panel, and a filler disposed to fill a space between at least a portion of the display panel and the receiver, wherein the filler includes a coupler having a shape that may be coupled to the receiver.

The display panel may be bent in the bent area such that lower surfaces thereof face each other, and the filler may be disposed to fill a space between the lower surfaces facing each other, and a space between the bent area and the receiver.

The coupler may have a stair-type step difference, and the receiver may be coupled to the step difference of the coupler.

These and other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4 and 5 are schematic cross-sectional views of the display apparatus according to an embodiment;

FIGS. 6 and 7 are schematic cross-sectional views of the display apparatus according to another embodiment;

FIGS. 8 and 9 are schematic cross-sectional views of the display apparatus according to another embodiment;

FIG. 10 is a schematic cross-sectional view of a display apparatus according to another embodiment;

FIGS. 11, 12, 13, and 14 are views showing a method of manufacturing a display apparatus according to an embodiment; and FIG. 15 is a schematic view showing a method of manufacturing the display apparatus according to another embodiment.

DETAILED DESCRIPTION

Figure 1A:
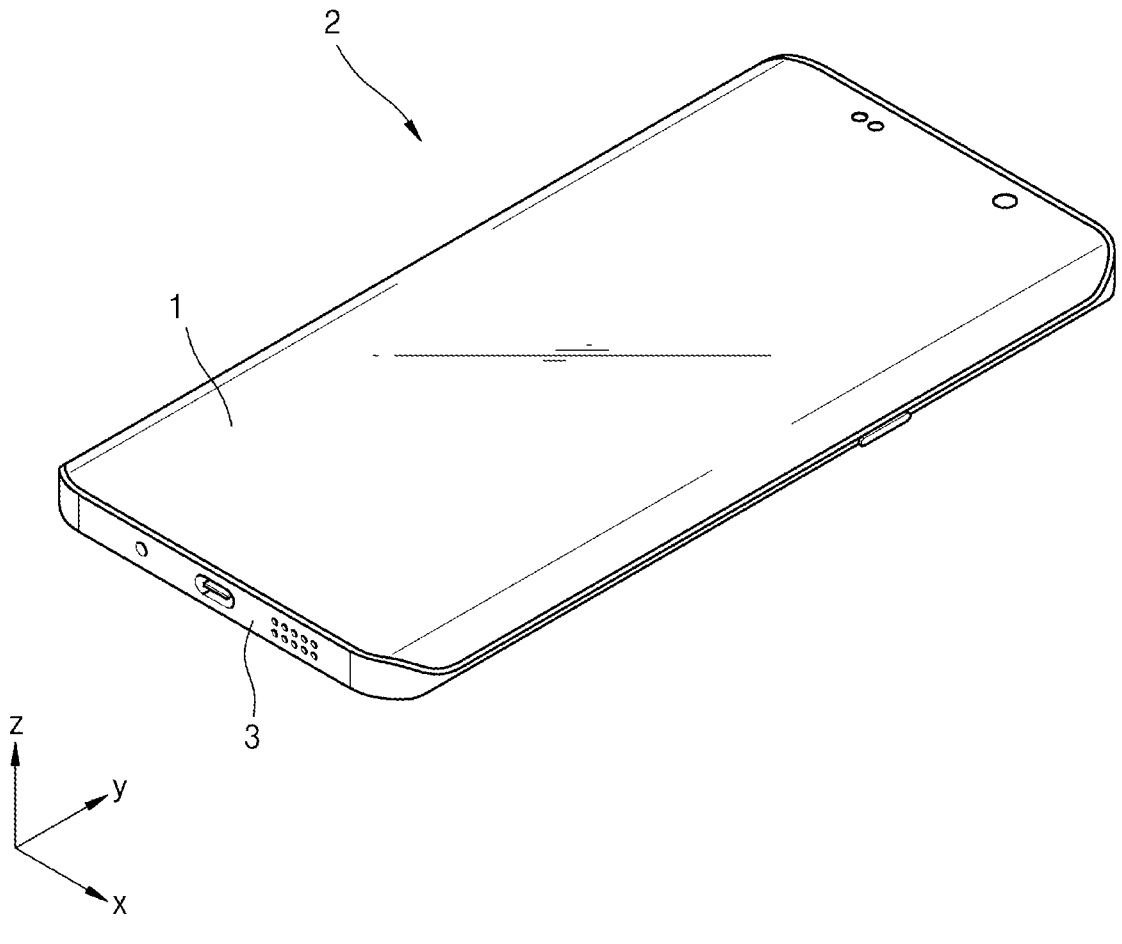
FIG. 1A is a schematic perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

The X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Figure 1B:
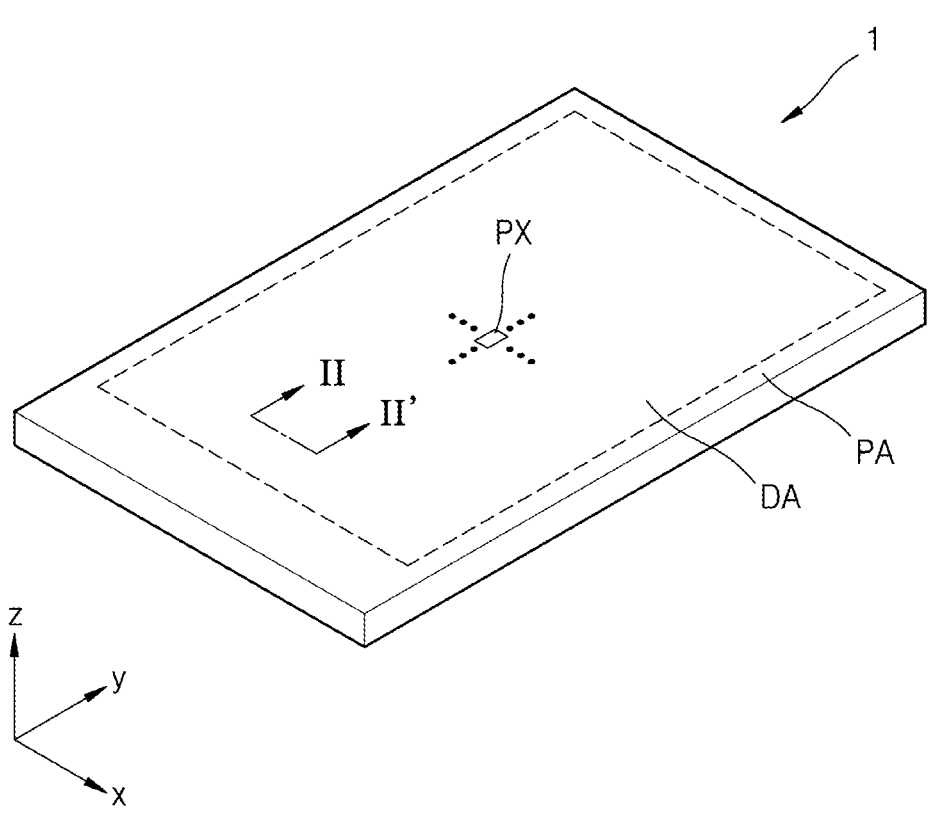
FIG. 1B is a schematic perspective view of a display apparatus according to an embodiment.

FIG. 1A is a schematic perspective view of an electronic apparatus 2 according to an embodiment. FIG. 1B is a schematic perspective view of a display apparatus 1 according to an embodiment.

Referring to FIGS. 1A and 1B, the display apparatus 1 is an apparatus configured to display moving images or still images, and the electronic apparatus 2 may be configured to display a screen or to input or output data. Although it is shown in FIG. 1A that the display apparatus 1 is used in a mobile phone according to an embodiment, the embodiment is not limited thereto, and the display apparatus 1 may be used as a display screen of various electronic apparatuses including televisions, notebook computers, monitors, advertisement boards, Internet of things (IoTs) as well as portable electronic apparatuses including mobile phones, smart phones, tablet personal computers (PCs), mobile communication terminals, electronic organizers, electronic books, portable multimedia players (PMPs), navigations, and ultra mobile personal computers (UMPCs). In addition, the display apparatus 1 according to an embodiment may be used in electronic apparatuses such as wearable devices including smartwatches, watchphones, glasses-type displays, and head-mounted displays (HMDs). In addition, in an embodiment, the display apparatus 1 is applicable to a display screen in various electronic apparatuses, such as a display screen in instrument panels for automobiles, center fascias for automobiles, or center information displays (CIDs) arranged on a dashboard, room mirror displays that replace side mirrors of automobiles, and displays of an entertainment system arranged on the backside of front seats for backseat passengers in automobiles.

In an embodiment, the display apparatus 1 may be received in a housing 3 of the electronic apparatus 2. The housing 3 may be a cover configured to protect inner elements such as the display apparatus 1 and form the appearance of the electronic apparatus 2. In addition, the display apparatus 1 may be connected to an electronic module of the electronic apparatus 2 and driven on the electronic apparatus 2. Hereinafter, the display apparatus 1 is mainly described.

The display apparatus 1 may have an approximately rectangular shape as shown in FIG. 1B. As an example, the display apparatus 1 may have a rectangular planar shape as a whole, having short sides extending in a first direction (e.g., an x direction or a −x direction) and long sides extending in a second direction (e.g., a y direction or a −y direction) as shown in FIG. 1B. In an embodiment, a portion where a short side extending in the first direction (e.g., the x direction or the −x direction) meets a long side extending in the second direction (e.g., the y direction or the −y direction) may have a rectangular shape or a round shape with a preset curvature. In addition, the planar shape of the display apparatus 1 is not limited to rectangular shapes but may have other polygons, circular shapes, or elliptical shapes.

The display apparatus 1 may include a display area DA and a peripheral area PA. The display area DA may be configured to display images. In this case, pixels PX may be arranged in the display area DA. The display apparatus 1 may be configured to display images by using light emitted from the pixels PX. Each pixel PX may be configured to emit light by using a display element. In an embodiment, each pixel PX may be configured to emit red, green, or blue light. In an embodiment, each pixel PX may be configured to emit red, green, blue, or white light.

The peripheral area PA may be a non-display area in which images are not displayed. The peripheral area PA may surround at least a portion of the display area DA. As an example, the peripheral area PA may surround the display area DA entirely. A driver, a power line, or the like may be arranged in the peripheral area PA, wherein the driver is configured to provide electrical signals to the pixels PX, and the power line is configured to provide power. As an example, a scan driver may be arranged in the peripheral area PA, wherein the scan driver is configured to apply scan signals to the pixels PX. In addition, a data driver may be arranged in the peripheral area PA, wherein the data driver is configured to apply data signals to the pixels PX.

Figure 2:
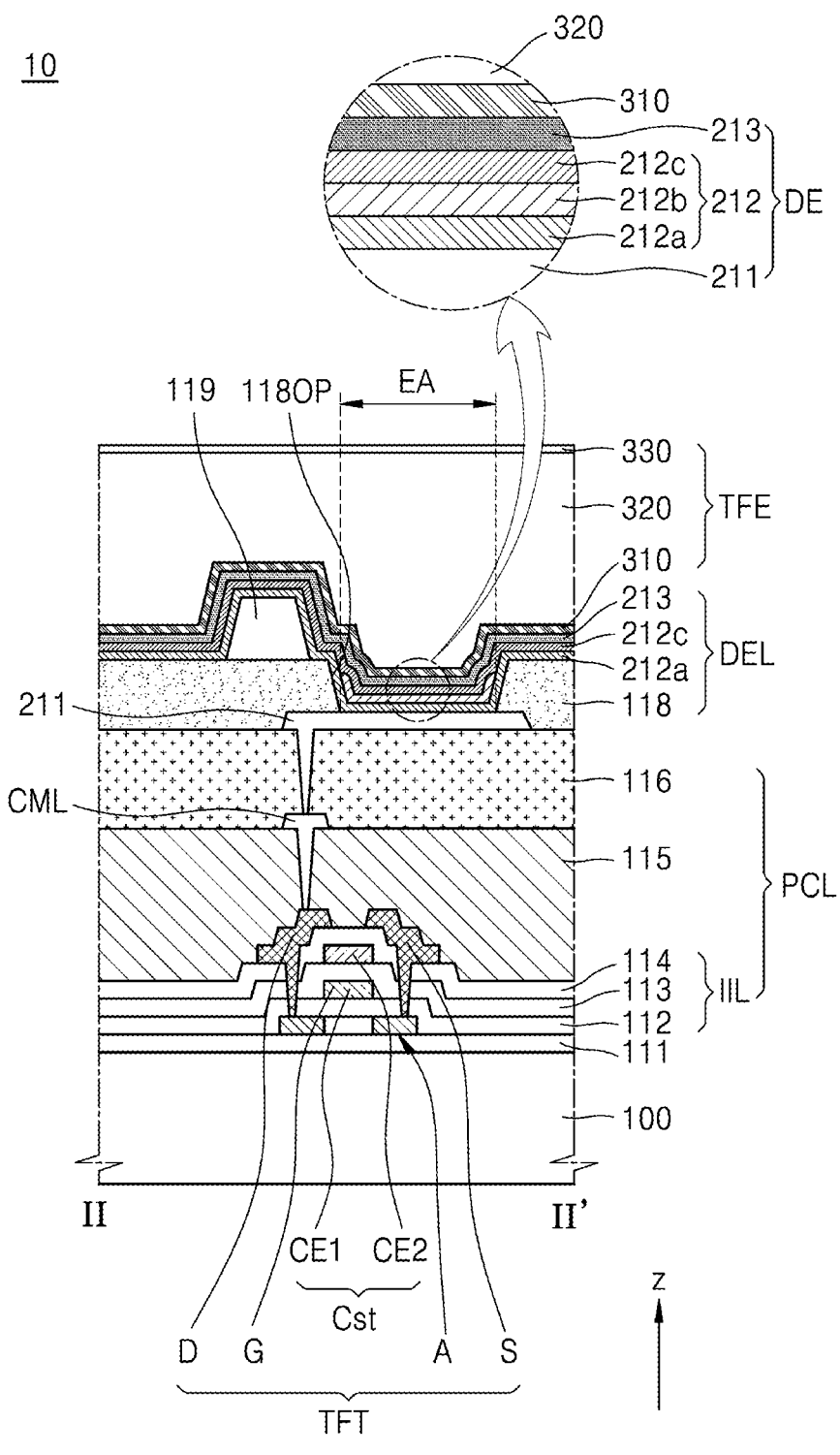
FIG. 2 is a cross-sectional view of a display panel according to an embodiment, taken along line II-II' of FIG. 1B.

FIG. 2 is a cross-sectional view of a display panel 10 according to an embodiment, taken along line II-II' of FIG. 1B.

Referring to FIG. 2, the display apparatus 1 (see FIG. 1B) may include the display panel 10. In addition, the display panel 10 may include a substrate 100, a buffer layer 111, a pixel circuit layer PCL, a display element DEL, and a thin-film encapsulation layer TFE.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like. In an embodiment, the substrate 100 may have a multi-layered structure including a base layer and a barrier layer (not shown) each including the above polymer resin. The substrate 100 including the polymer resin is flexible, rollable, or bendable.

The buffer layer 111 may be disposed on the substrate 100. The buffer layer 111 may include an inorganic insulating material such as silicon nitride, silicon oxynitride, and silicon oxide, and include a single layer or a multi-layer including the above inorganic insulating materials.

The pixel circuit layer PCL may be disposed on the buffer layer 111. The pixel circuit layer PCL may include a thin-film transistor TFT, an inorganic insulating layer IIL, a first planarization layer 115, and a second planarization layer 116, wherein the thin-film transistor TFT is included in a pixel circuit, and the inorganic insulating layer IIL, the first planarization layer 115, and the second planarization layer 116 are disposed under or on elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polycrystalline silicon. Alternatively, the semiconductor layer A may include amorphous silicon, an oxide semiconductor, or an organic semiconductor. The semiconductor layer A may include a channel region, a drain region, and a source region, the drain region and the source region being on two opposite sides of the channel region. A gate electrode G may overlap the channel region.

The gate electrode G may include a low-resistance metal material. The gate electrode G may include a conductive material including molybdenum (Mo), aluminum (Al), copper (Cu), and titanium (Ti) and have a single-layered structure or a multi-layered structure including the above materials.

The first gate insulating layer 112 between the semiconductor layer A and the gate electrode G may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) or zinc peroxide ($ZnO_2$).

The second gate insulating layer 113 may cover the gate electrode G. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) or zinc peroxide ($ZnO_2$).

An upper electrode CE2 of a storage capacitor Cst may be disposed on the second gate insulating layer 113. The upper electrode CE2 may overlap the gate electrode G there below. In this case, the gate electrode G and the upper electrode CE2 overlapping each other with the second gate insulating layer 113 therebetween may constitute the storage capacitor Cst. That is, the gate electrode G may serve as a lower electrode CE1 of the storage capacitor Cst. As described above, the storage capacitor Cst may overlap the thin-film transistor TFT. In an embodiment, the storage capacitor Cst may be formed not to overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), or copper (Cu), and include a single layer or a multi-layer including the above materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) or zinc peroxide ($ZnO_2$). The interlayer insulating layer 114 may include a single layer or a multi-layer including the inorganic insulating material.

A drain electrode D and a source electrode S may each be disposed on the interlayer insulating layer 114. The drain electrode D and the source electrode S may each include a material having high conductivity. The drain electrode D and the source electrode S may each include a conductive material including molybdenum (Mo), aluminum (Al), copper (Cu), and titanium (Ti) and include a single layer or a multi-layer including the above materials. In an embodiment, the drain electrode D and the source electrode S may each have a multi-layered structure of Ti/Al/Ti.

The first planarization layer 115 may cover the drain electrode D and the source electrode S. The first planarization layer 115 may include an organic insulating material. The first planarization layer 115 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be disposed on the first planarization layer 115. In this case, the connection electrode CML may be connected to the drain electrode D or the source electrode S through a contact hole of the first planarization layer 115. The connection electrode CML may include a material having a high conductivity. The connection electrode CML may include a conductive material including molybdenum (Mo), aluminum (Al), copper (Cu), and titanium (Ti) and have a single-layered structure or a multi-layered structure including the above materials. In an embodiment, the connection electrode CML may have a multi-layered structure of Ti/Al/Ti.

The second planarization layer 116 may cover the connection electrode CML. The second planarization layer 116 may include an organic insulating layer. The second planarization layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be disposed on the pixel circuit layer PCL. The display element layer DEL may include a display element DE. The display element DE may be an organic light-emitting diode OLED. The pixel electrode 211 of the display element DE may be electrically connected to the connection electrode CML through a contact hole in the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 211 may further include a layer on/under the reflective layer, the layer including ITO, IZO, ZnO, or $In_2O_3$.

A pixel-defining layer 118 may be disposed on the pixel electrode 211, wherein the pixel-defining layer 118 includes an opening 1180P exposing a central portion of the pixel electrode 211. The pixel-defining layer 118 may include an organic insulating material or an inorganic insulating material. The opening 1180P may define an emission area EA of light emitted from the display element DE. As an example, the width of the opening 1180P may correspond to the width of the emission area EA of the display element DE.

In an embodiment, the pixel-defining layer 118 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide) or metal nitride particles (e.g., chrome nitride). In the case where the pixel-defining layer 118 includes a light-blocking material, external light reflection by a metal structure disposed below the pixel-defining layer 118 may be reduced.

A spacer 119 may be disposed on the pixel-defining layer 118. The spacer 119 may be designed to prevent destruction of the substrate 100 in a method of manufacturing a display apparatus. When the display panel is manufactured, a mask sheet may be used. In this case, the mask sheet may enter the inside of the opening 1180P of the pixel-defining layer 118 or be closely attached to the pixel-defining layer 118. The spacer 119 may prevent a portion of the substrate 100 from being damaged or destroyed by the mask sheet while a deposition material is deposited on the substrate 100.

The spacer 119 may include an organic insulating material such as polyimide. Alternatively, the spacer 119 may include an inorganic insulating material such as silicon nitride or silicon oxide, or include an organic insulating material and an inorganic insulating material.

In an embodiment, the spacer 119 may include a different material from a material of the pixel-defining layer 118. Alternatively, in another embodiment, the spacer 119 may include the same material as a material of the pixel-defining layer 118. In this case, the pixel-defining layer 118 and the spacer 119 may be formed together during a mask process that uses a half-tone mask and the like.

An intermediate layer 212 may be disposed on the pixel-defining layer 118. The intermediate layer 212 may include an emission layer 212b disposed in the opening 1180P of the pixel-defining layer 118. The emission layer 212b may include a polymer or low-molecular weight organic material emitting light of a preset color.

A first functional layer 212a and a second functional layer 212c may be respectively disposed under and on the emission layer 212b. The first functional layer 212a may include, for example, a hole transport layer (HTL), or include an HTL and a hole injection layer (HIL). The second functional layer 212c is an element disposed on the emission layer 212b and may be optional. The second functional layer 212c may include an electron transport layer (ETL) or an electron injection layer (EIL). Like an opposite electrode 213 described below, the first functional layer 212a or the second functional layer 212c may be common layers covering the substrate 100 entirely.

The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the opposite electrode 213 may further include a layer on the (semi) transparent layer, the layer including ITO, IZO, ZnO, or In$_2$O$_3$.

In an embodiment, a capping layer (not shown) may be further disposed on the opposite electrode 213. The capping layer may include lithium fluoride (LiF), an inorganic material, or an organic material.

The thin-film encapsulation layer TFE may be disposed on the opposite electrode 213. The thin-film encapsulation layer TFE may include at least one inorganic encapsulation layer and at least one organic encapsulation layer. It is shown in FIG. 2 that the thin-film encapsulation layer TFE includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Figure 3:
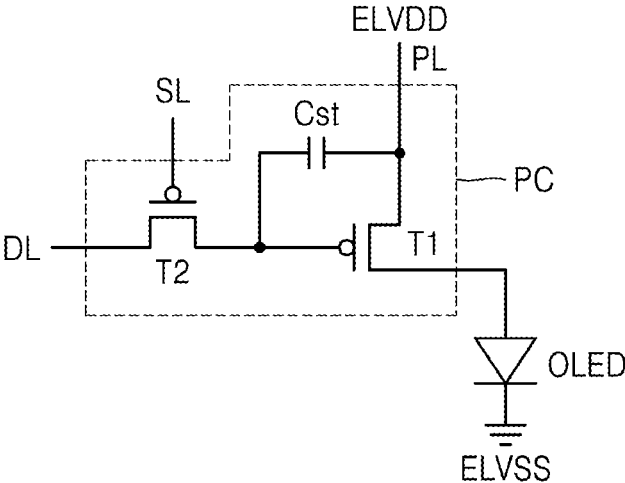
FIG. 3 is a schematic equivalent circuit diagram of a pixel circuit applicable to a display panel.

FIG. 3 is a schematic equivalent circuit diagram of a pixel circuit PC applicable to a display panel.

Referring to FIG. 3, the pixel circuit PC may be connected to a display element, for example, an organic light-emitting diode OLED. The pixel circuit PC may include a driving thin-film transistor T1, a switching thin-film transistor T2, and a storage capacitor Cst. In addition, the organic light-emitting diode OLED may emit red, green, or blue light, or emit red, green, blue, or white light.

The switching thin-film transistor T2 is connected to a scan line SL and a data line DL, and configured to transfer a data voltage or a data signal to the driving thin-film transistor T1 according to a switching voltage or a switching signal input from the scan line SL, the data voltage or the data signal being input from the data line DL. The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current according to the voltage stored in the storage capacitor Cst, the driving current flowing from the driving voltage line PL to the organic light-emitting diode OLED. The organic light-emitting diode OLED may be configured to emit light having a preset brightness corresponding to the driving current. The opposite electrode of the organic light-emitting diode OLED may be configured to receive a second power voltage ELVSS.

Though it is shown in FIG. 3 that the pixel circuit PC includes two thin-film transistors and one storage capacitor, the pixel circuit PC may include three, four, five, or more thin-film transistors.

Figure 4:
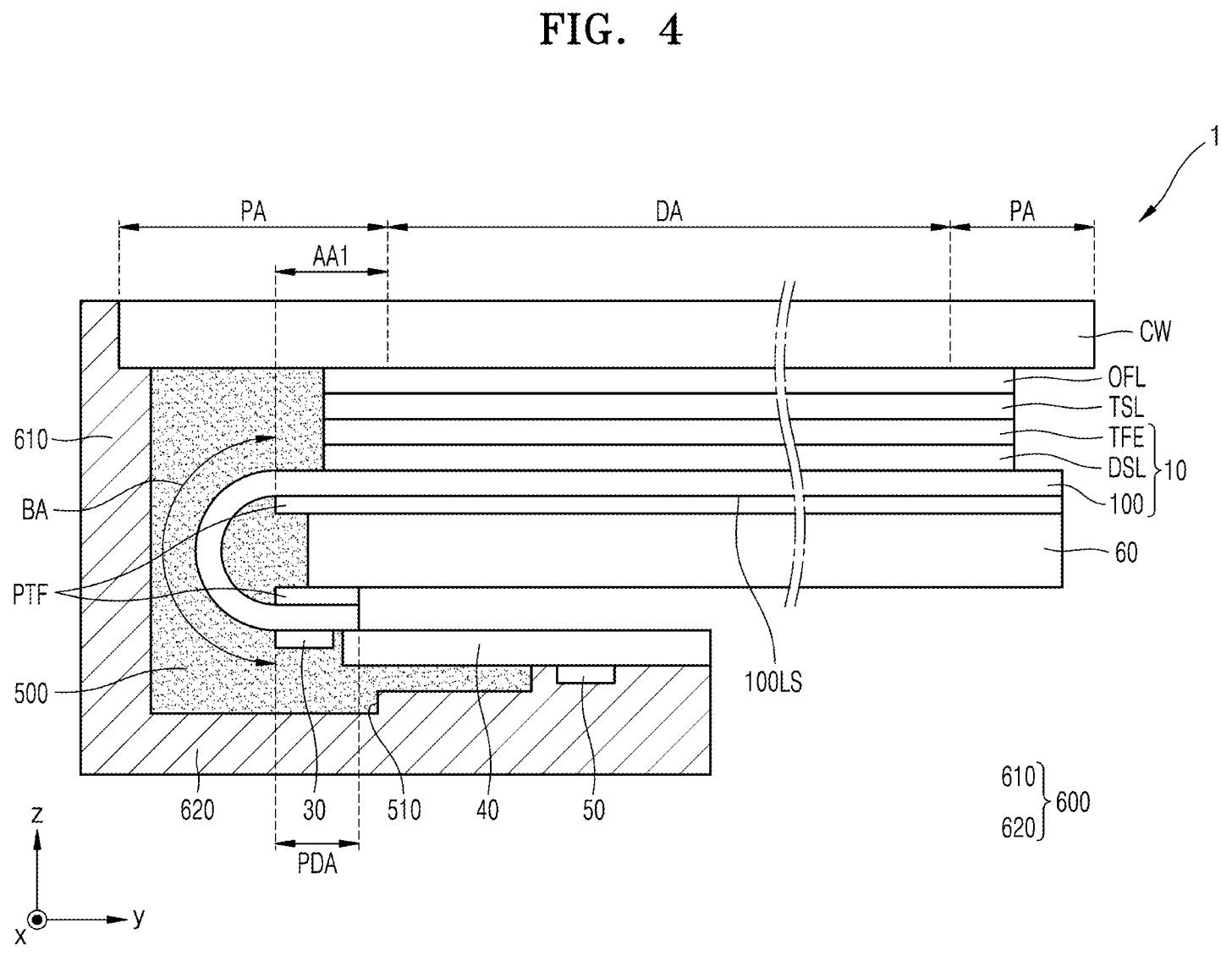
Figure 5:
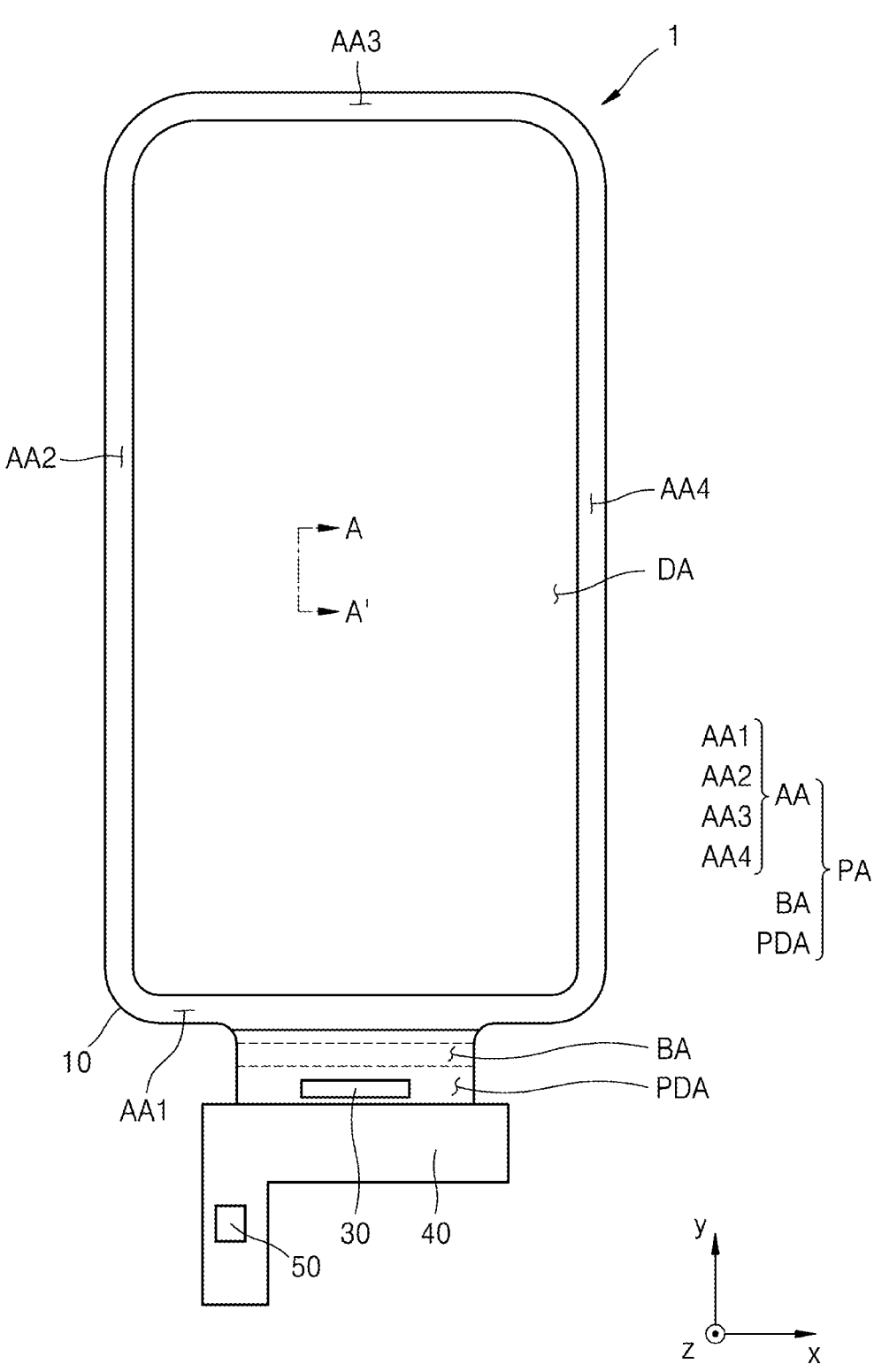

FIGS. 4 and 5 are schematic cross-sectional views of the display apparatus 1 according to an embodiment. FIG. 4 schematically shows a state after a portion of the display apparatus 1 is bent, and FIG. 5 schematically shows a state before a portion of the display apparatus 1 is bent.

Referring to FIGS. 4 and 5, the display apparatus 1 may include the display panel 10, a touch sensor layer TSL, an optical functional layer OFL, a cover window CW, a display driver 30, a display circuit board 40, a touch sensor driver 50, a cushion layer 60, and a protective film PTF.

The display panel 10 may be configured to display information processed by the display apparatus 1. As an example, the display panel 10 may display execution screen information of an application driven in the display apparatus 1, or user interface (UI) and graphic user interface (GUI) information corresponding to execution screen information.

The display panel 10 may include the display element. As an example, the display panel 10 may include an organic light-emitting display panel that uses organic light-emitting diodes, a micro light-emitting diode display panel that uses micro light-emitting diodes (LED), a quantum-dot light-emitting display panel that uses a quantum-dot emission layer, or an inorganic light-emitting display panel that uses inorganic light-emitting elements including an inorganic semiconductor. Hereinafter, the case where the display panel 10 is an organic light-emitting display panel that uses organic light-emitting diodes as display elements is mainly described in detail.

The display panel 10 may include the substrate 100 and a multi-layer disposed on the substrate 100. In an embodiment, the display panel 10 may include the substrate 100, a display layer DSL, and the thin-film encapsulation layer TFE. In this case, the display area DA and the peripheral area PA may be defined in the substrate 100 or the multi-layer. As an example, the display panel 10 may include the display area DA and the peripheral area PA. In addition, the peripheral area PA may include an adjacent area AA surrounding the display area DA, a pad area PDA, and a bent area BA.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like. In an embodiment, the substrate 100 may have a multi-layered structure including a base layer and a barrier layer (not shown) each including the above polymer resin. The substrate 100 including the polymer resin is flexible, rollable, or bendable.

The substrate 100 may be bent in the bent area BA. In this case, at least a portion of a lower surface 100LS of the substrate 100 may face each other, and the pad area PDA of the substrate 100 may be disposed lower than other portions of the substrate 100. Accordingly, the area of the peripheral area PA viewed by a user may be reduced. In an embodiment, at least a portion of the display area DSL, at least a portion of the thin-film encapsulation layer TFE, and at least a portion of the touch sensor layer TSL may be also provided in the bent area BA and the pad area PDA. In this case, at least a portion of the display area DSL, at least a portion of the thin-film encapsulation layer TFE, and at least a portion of the touch sensor layer TSL may be also bent in the bent area BA.

The display layer DSL may be disposed on the substrate 100. The display layer DSL may include pixel circuits and display elements. In this case, each of the pixel circuits may be connected to each of the display elements. The pixel circuit may include the thin-film transistor and the storage capacitor. Accordingly, the display layer DSL may include a plurality of display elements, a plurality of thin-film transistors, and a plurality of storage capacitors. In addition, the display layer DSL may further include insulating layers disposed therebetween.

The thin-film encapsulation layer TFE may be disposed on the display layer DSL. The thin-film encapsulation layer TFE may be disposed on the display element and may cover the display element. In an embodiment, the thin-film encapsulation layer TFE may include at least one inorganic encapsulation layer and at least one organic encapsulation layer. The at least one inorganic encapsulation layer may include at least one inorganic material among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). The at least one organic encapsulation layer may include a polymer-based material. The polymer-based material may include an acryl-based resin, an epoxy-based resin, polyimide, and polyethylene. In an embodiment, the at least one organic encapsulation layer may include acrylate.

The touch sensor layer TSL may be disposed on the thin-film encapsulation layer TFE. The touch sensor layer TSL may obtain coordinate information corresponding to an external input, for example, a touch event. The touch sensor layer TSL may include a sensor electrode and touch lines connected to the sensor electrode. The touch sensor layer TSL may sense an external input by using a self-capacitance method or a mutual capacitance method.

The touch sensor layer TSL may be disposed on the thin-film encapsulation layer TFE. Alternatively, the touch sensor layer TSL may be separately formed on a touch substrate and then coupled to the thin-film encapsulation layer TFE through an adhesive layer such as an optically clear adhesive. In an embodiment, the touch sensor layer TSL may be directly formed on the thin-film encapsulation layer TFE. In this case, the adhesive layer may not be disposed between the touch sensor layer 400 and the thin-film encapsulation layer TFE.

The optical functional layer OFL may be disposed on the touch sensor layer TSL. The optical functional layer OFL may reduce the reflectivity of light (external light) incident toward the display apparatus 1 from outside, or improve the color purity of light emitted from the display apparatus 1. In an embodiment, the optical functional layer OFL may include a retarder or a polarizer. The retarder may include a film-type retarder or a liquid crystal-type retarder. The retarder may include a $\lambda/2$ retarder or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the optical functional layer OFL may include a black matrix and color filters. The color filters may be arranged by taking into account colors of light emitted respectively from the pixels of the display apparatus 1. The color filters may each include red, green, or blue pigment or dye. Alternatively, the color filters may each further include quantum dots in addition to the pigment or dye. Alternatively, some of the color filters may not include pigment or dye, and may include scattering particles such as titanium oxide.

In another embodiment, the optical functional layer OFL may include a destructive interference structure. The destructive interference structure may include a first reflection layer and a second reflection layer respectively disposed on different layers. First-reflected light and second-reflected light respectively reflected by the first reflection layer and the second reflection layer may destructively interfere and thus the reflectivity of external light may be reduced.

In the case where the touch sensor layer TSL or the optical functional layer OFL are disposed on the display panel 10, the cover window CW may be disposed on the touch sensor layer TSL or the optical functional layer OFL. The cover window CW may be configured to protect the display panel 10. In an embodiment, the cover window CW may be a flexible window. The cover window CW may be configured to protect the display panel 10 while easily bending according to external force without occurrence of cracks and the like. The cover window CW may include at least one of glass, sapphire, and plastic. The cover window CW may be, for example, ultra-thin glass or colorless polyimide. In an embodiment, the cover window CW may have a structure in which a flexible polymer layer is disposed on one surface of a glass substrate, or include only a polymer layer.

The display driver 30 may be arranged in the pad area PDA. The display driver 30 may receive control signals and power voltages, generate and output signals and voltages for driving the display panel 10. The display driver 30 may include an integrated circuit (IC).

The display circuit board 40 may be electrically connected to the display panel 10. As an example, the display circuit board 40 may be electrically connected to the pad area PDA of the substrate 100 by an anisotropic conductive film.

The display circuit board 40 may be a flexible printed circuit board (FPCB) that may be bent or a rigid printed circuit board (PCB) that is strong and not easily bent. Alternatively, the display circuit board 40 may be a composite printed circuit board including both a rigid printed circuit board and a flexible printed circuit board depending on the case.

The touch sensor driver 50 may be disposed on the display circuit board 30. The touch sensor driver 50 may include an integrated circuit. The touch sensor driver 50 may be attached to the display circuit board 30. The touch sensor driver 50 may be electrically connected to sensor electrodes of the touch sensor layer TSL of the display panel 10 through the display circuit board 40.

In addition, a power supply unit may be additionally disposed on the display circuit board 40. The power supply unit may be configured to supply a driving voltage for driving the pixels of the display panel 10 and the display driver 30.

The protective film PTF may be patterned and attached to the lower surface 100LS of the substrate 100. In this case, the protective film PTF may be attached to a portion of the substrate 100 except for the bent area BA of the substrate 100. In this case, a portion of the protective film PTF may be attached to the lower surface 100LS of the substrate 100 to correspond to the display area DA. Another portion of the protective film PTF may be attached to the lower surface 100LS of the substrate 100 to correspond to the pad area PDA.

In an embodiment, the cushion layer 60 may be disposed between the protective films PTF. The cushion layer 60 may be configured to absorb external impact and prevent the display panel 10 from being destroyed. The cushion layer 60 may include a polymer resin such as polyurethane, polycarbonate, polypropylene, polyethylene, and the like, or include an elastic material such as rubber, a urethane-based material, a sponge foam-molded with an acryl-based material, and the like.

As described above, the display panel 10 may include the display area DA and the peripheral area PA surrounding the display area DA. The peripheral area PA may include the adjacent area AA, the pad area PDA, and the bent area BA, wherein the adjacent area AA surrounds the display area DA, the pad area PDA is arranged on one side of the adjacent area AA, and the bent area BA is arranged between the pad area PDA and the adjacent area AA.

The adjacent area AA may surround the display area DA. As an example, in the case where the display area DA is formed in a quadrangular shape in a plan view, the adjacent area AA may include a first adjacent area AA1, a second adjacent area AA2, a third adjacent area AA3, and a fourth adjacent area AA4 respectively surrounding the sides of the display area DA.

The pad area PDA may be arranged outside the display area DA, for example, outside the first adjacent area AA1. In an embodiment, the pad area PDA may be arranged farther away from the display area DA than the bent area BA. In an embodiment, the pad area PDA may be a region in which the display driver 30 is arranged. The pad area PDA may include the edge of the peripheral area PA. In an embodiment, the pad area PDA may be connected to the display circuit board 40.

The bent area BA may be arranged between the display area DA and the pad area PDA. In addition, the bent area BA may be arranged between the first adjacent area AA1 and the pad area PDA. The bent area BA is a region in which the display panel 10 is bent and may denote a portion of the display panel 10.

In the case where the display apparatus 1 is used in combination with an electronic apparatus, a receiver 600 may be a connection member for combining with the electronic apparatus. In an embodiment, the receiver 600 may be arranged along the circumference of the display panel 10 to receive the display panel 10. Specifically, the receiver 600 may be arranged along the adjacent area AA to be adjacent to the adjacent area AA of the display panel 10. The receiver 600 may be arranged to receive, for example, the first adjacent area AA1 to the fourth adjacent area AA4. Alternatively, the receive 600 may be arranged to receive, for example, at least one of the first adjacent area AA1 to the fourth adjacent area AA4. Hereinafter, for convenience of description, the receiver 600 arranged adjacent to the first adjacent area AA1 is mainly described.

In an embodiment, the receiver 600 may include a first receiver 610 and a second receiver 620. The first receiver 610 may be a portion of the receiver 600 substantially vertically extending. When the first receiver 610 extends vertically, it may mean that the first receiver 610 extends in a direction in which the display panel 10, the touch sensor layer TSL, and the optical functional layer OFL are stacked. The second receiver 620 may be a portion of the receiver 600 substantially horizontally extending. When the second receiver 620 extends horizontally, it may mean that the second receiver 620 extends in a direction parallel to a stack surface of the display panel 10. That is, an extension direction of the second receiver 620 may be substantially perpendicular to an extension direction of the first receiver 610.

One side of the first receiver 610 may be connected to the circumference of the cover window CW and may perpendicularly extend from the circumference of the cover window CW. Accordingly, the first receiver 610 may be arranged outside the bent area BA. The second receiver 620 may have one side connected to the first receiver 610 and extend horizontally from the first receiver 610. Accordingly, the second receiver 620 may be disposed under the pad area PDA, and another side of the second receiver 620 may be connected to the display circuit board 40.

Accordingly, a space between the receiver 600, for example, the first receiver 610 and the second receiver 620 and the display panel 10 may be sealed. Specifically, as the bent area BA is bent, the lower surface 100LS of the substrate 100 may face each other, and a space between the bent area BA and the lower surface 100LS of the substrate 100 facing each other may be defined as an inner space of the bent area BA. In addition, a space between the bent area BA and the receiver 600 may be defined as an outer space of the bent area BA. The inner space and the outer space of the bent area BA may be sealed by the receiver 600.

A filler 500 may be disposed in the space between the receiver 600 and the display panel 10. Specifically, the filler 500 may be disposed to fill the inner space and the outer space of the bent area BA. In an embodiment, the filler 500 may be formed by a mold frame and then the receiver 600 may disposed to be coupled to the filler 500. In another embodiment, the receiver 600 may be disposed first, and when resin is injected to the space sealed by the receiver 600 and the resin is cured, the filler 500 may be formed.

In an embodiment, the filler 500 may be disposed to fill the outer space of the bent area BA. The filler 500 may be disposed to fill a space above the first adjacent area AA1, that is, a space between the first adjacent area AA1 and the cover window CW. Accordingly, the filler 500 may cover the lateral surface of the touch sensor layer TSL and the optical functional layer OFL. In addition, the filler 500 may cover the outer surface of the bent area BA and cover the pad area PDA. In addition, the filler 500 may cover at least a portion of the display circuit board 40.

In an embodiment, the filler 500 may be disposed to fill the inner space of the bent area BA. Accordingly, the filler 500 may fill a space between the inner surface of the bent area BA and the cushion layer 60. In addition, the filler 500 may fill a space between the protective film PTF facing each other.

Because the filler 500 is disposed to fill the outer space and the inner space of the bent area BA as described above, the display apparatus 1, particularly, the bent area BA may be protected from external impact. Particularly, the filler 500 is disposed to fill the inner space of the bent area BA to protect the bent area BA, and the filler 500 may fill the space without being affected by a position change of the protective film PTF and the like due to pushing caused by bending of the bent area BA. In addition, because, as a filling rate of the filler 500 in the inner space and the outer space of the bent area BA increases, the bent area BA may be more effectively protected from external impact, the filler 500 is disposed to fill the inner space and the outer space of the bent area BA, and thus, a reinforcing effect of the bent area BA may be increased.

In an embodiment, a filler 500 filling the inner space of the bent area BA may include the same material as a material of a filler 500 filling the outer space of the bent area BA. In another embodiment, the filler 500 filling the inner space of the bent area BA may include a different material from a material of the filler 500 filling the outer space of the bent area BA. As an example, the filler 500 filling the inner space of the bent area BA may have a different modulus of elasticity from a modulus of elasticity of the filler 500 filling the outer space of the bent area BA. Hereinafter, the case where the filler 500 filling the inner space of the bent area BA may include the same material as a material of the filler 500 filling the outer space of the bent area BA is mainly described.

The filler 500 may further include a coupler 510. The coupler 510 may reinforce coupling force between the filler 500 and the receiver 600. Accordingly, after the receiver 600 is coupled to the filler 500, the receiver 600 may not be separated from the filler 500.

In an embodiment, the coupler 510 may be formed to have a step difference. Specifically, the coupler 510 may be formed adjacent to the second receiver 620 to be coupled with the second receiver 620. As an example, the coupler 510 may be formed in the upper portion of the second receiver 620. The coupler 510 may have a step difference in a vertical direction, that is, a stack direction of the layers. The second receiver 620 may have a step difference corresponding thereto. The coupler 510 having the step difference may be coupled to be engaged with the second receiver 620. In addition, though not shown in the drawings, it may be understood that the coupler 510 may be formed in a stair type having a plurality of step differences. In addition, the coupler 510 may be formed adjacent to the first receiver 610 to be coupled to the first receiver 610. As an example, the coupler 510 may be formed to have a step difference in the inner surface of the first receiver 610. In this case, the coupler 510 may have a step difference in a horizontal direction, that is, a direction parallel to the stack surface of the layers. The first receiver 610 may have a step difference corresponding thereto. The coupler 510 having the step difference may be coupled to be engaged with the first receiver 610. In addition, in an embodiment, the coupler 510 may be formed adjacent to the first receiver 610 and the second receiver 620 to have a step difference to be coupled to the first receiver 610 and the second receiver 620.

Figure 6:
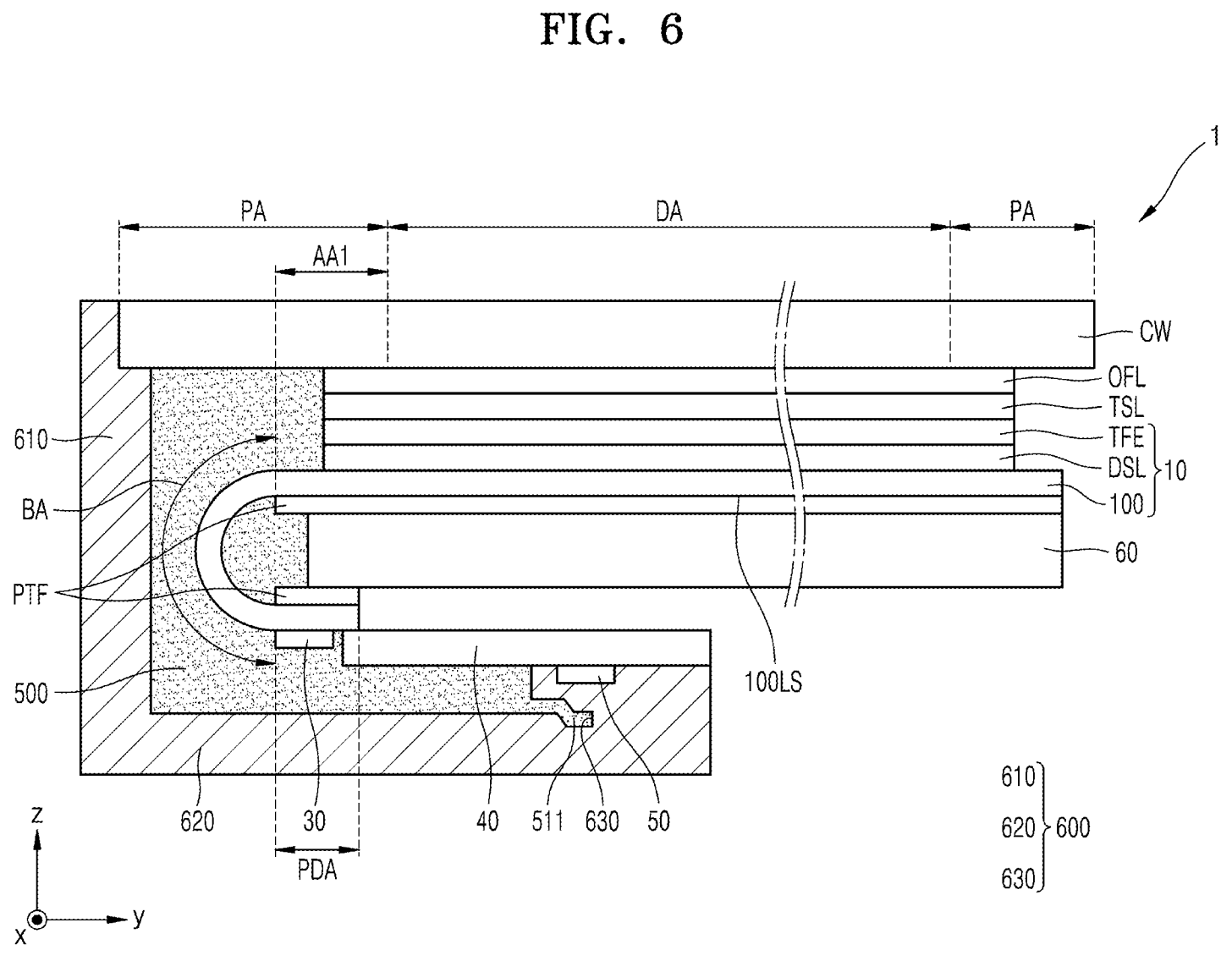
Figure 7:
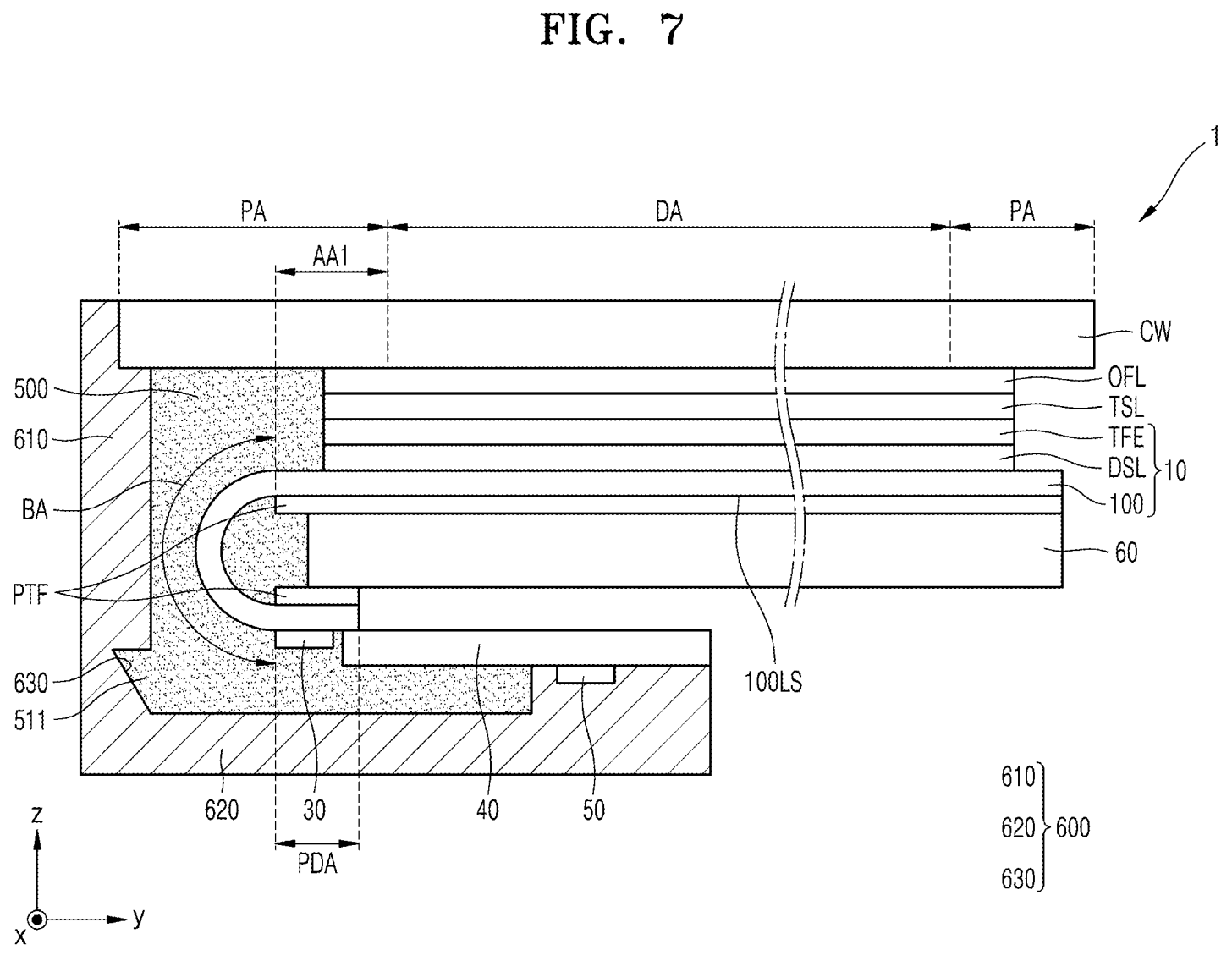

FIGS. 6 and 7 are schematic cross-sectional views of the display apparatus 1 according to another embodiment. Because the display apparatus according to an embodiment is similar to the display apparatus described above, differences are mainly described below in detail.

Referring to FIG. 6, the filler 500 may be disposed to fill the inner space and the outer space of the bent area BA. The filler 500 may include the coupler 510 that may be reinforce coupling with the receiver 600. In this case, the coupler 510 may include a coupling protrusion 511 protruding toward the receiver 600. In an embodiment, the coupling protrusion 511 may protrude toward the second receiver 620. As shown in FIG. 6, the coupling protrusion 511 may have a protruding cross-section formed in an 'L' shape. In another embodiment, the coupling protrusion 511 may have a protruding cross-section formed in a shape such as a straight line shape, a hook or a zigzag shape. In this case, the receiver 600, for example, the second receiver 620 may include a receiving concave portion 630 corresponding to the shape of the coupling protrusion 511. The receiving concave portion 630 may be formed to correspond to the coupling protrusion 511 and may be coupled to the coupling protrusion 511. Accordingly, coupling force between the filler 500 and the receiver 600 may be reinforced without a separate adhesive member. In addition, though it is shown in FIG. 6 that one coupling protrusion 511 and one receiving concave portion 630 corresponding thereto are provided, a plurality of coupling protrusions 511 and a plurality of receiving concave portions 630 may be provided. In the case where the plurality of coupling protrusions 511 are provided, the plurality of coupling protrusions 511 may be apart from each other in an extension direction of the first receiver 610 or the plurality of coupling protrusions 511 may be apart from each other in an extension direction of the second receiver 620. Hereinafter, the case where one coupling protrusion 511 and one receiving concave portion 630 corresponding thereto is mainly described.

Referring to FIG. 7, in an embodiment, the coupling protrusion 511 may protrude toward the first receiver 610. As shown in FIG. 7, the coupling protrusion 511 may have a protruding cross-section formed in a triangular shape. However, the embodiment is not limited thereto and the coupling protrusion 511 may have a protruding cross-section formed in a polygon such as a rectangle or a circle. Because the filler 500 fills a space between the receiver 600 and the display panel 10, even though the shape of the coupling protrusion 511 is structurally complicated, the filler 500 may be easily coupled to the receiver 600. In addition, because the shape of the coupling protrusion 511 is structurally complicated, coupling force between the filler 500 and the receiver 600 may be reinforced.

Figure 8:
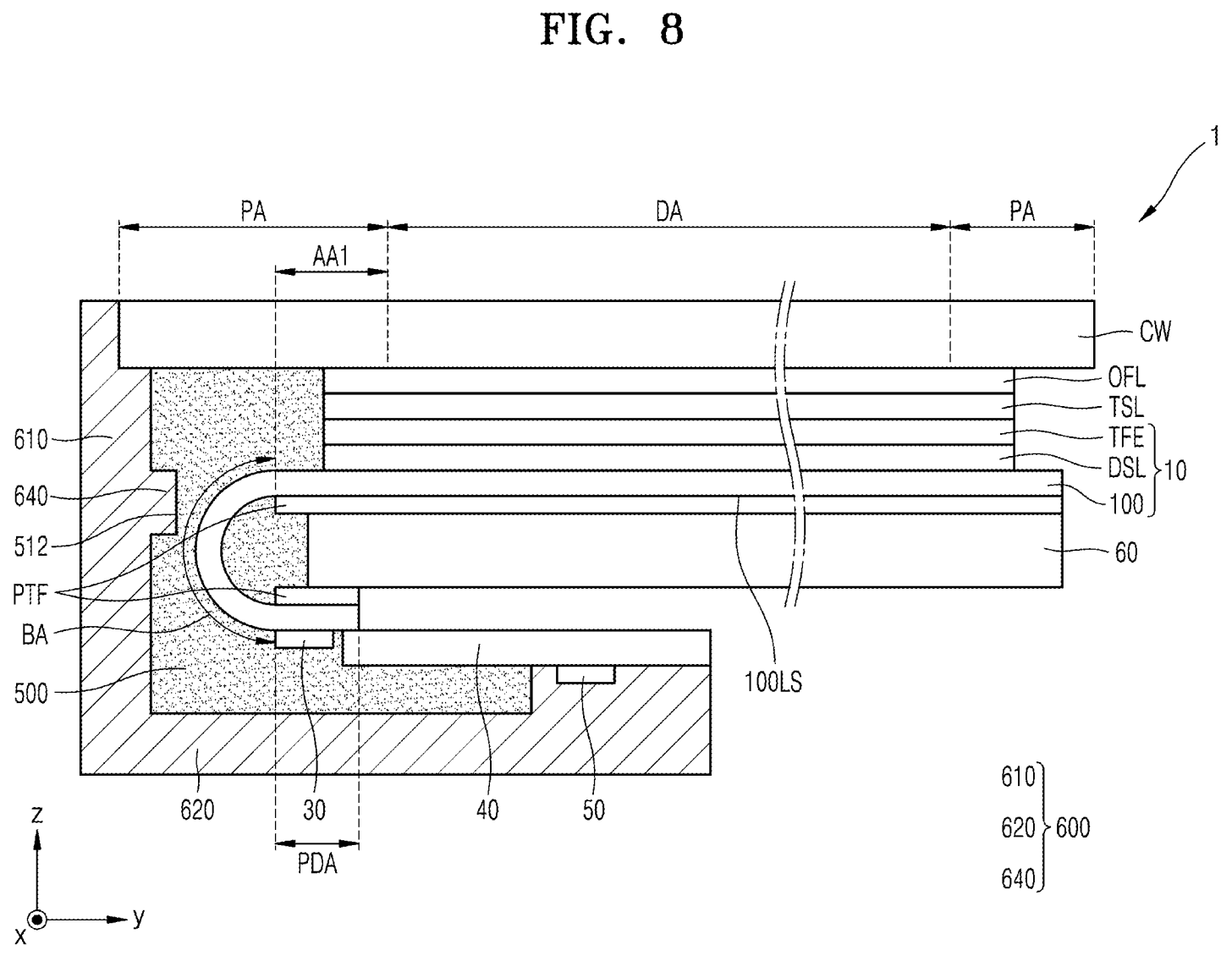
Figure 9:
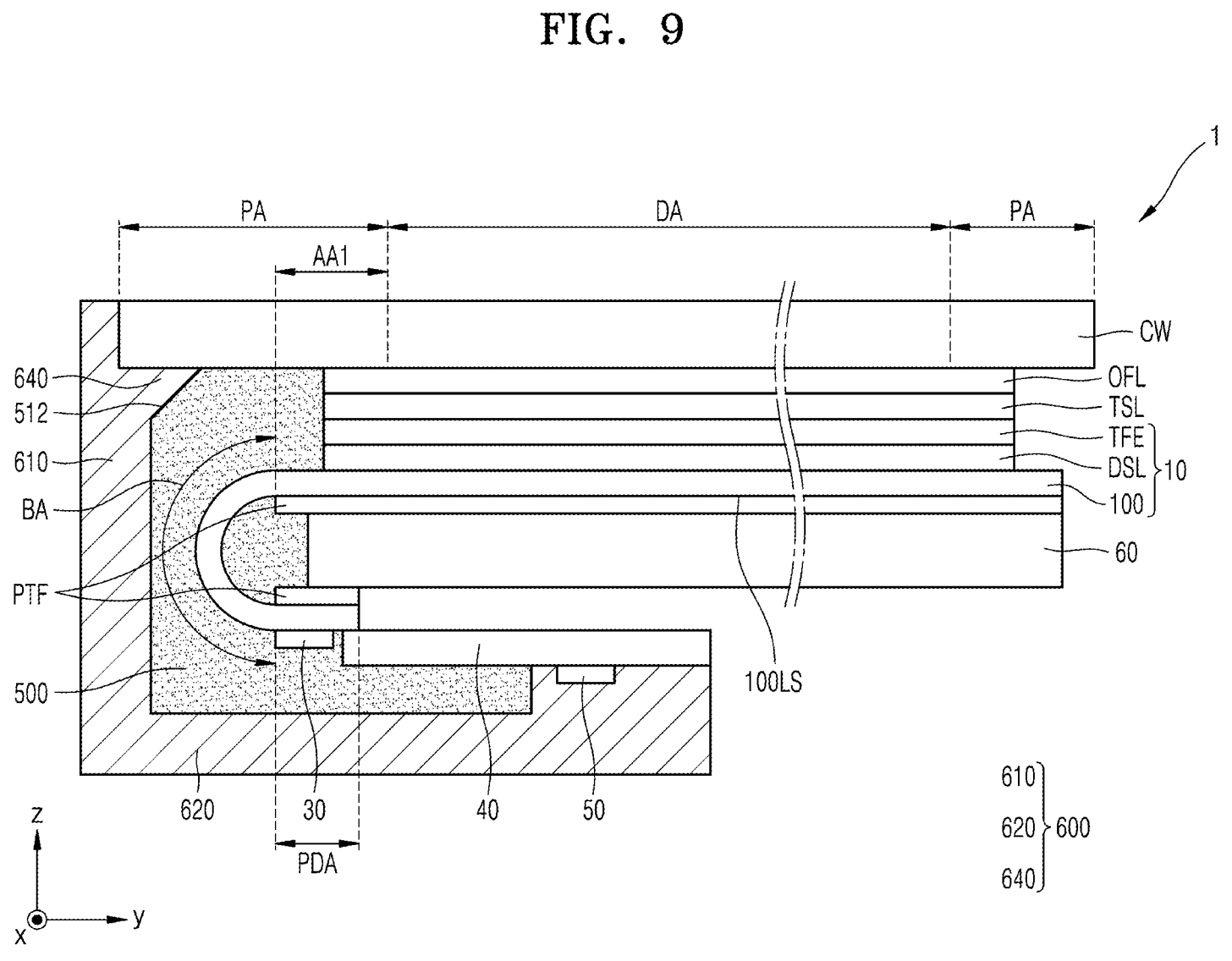

FIGS. 8 and 9 are schematic cross-sectional views of the display apparatus 1 according to another embodiment. Because the display apparatus according to an embodiment is similar to the display apparatus described above, differences are mainly described below in detail.

Referring to FIG. 8, in an embodiment, the receiver 600 may include a receiving protrusion 640 protruding toward the filler 500. As an example, the receiving protrusion 640 may protrude from the first receiver 610 to the filler 500. However, the embodiment is not limited thereto and it will be understood that the receiving protrusion 640 may protrude from the second receiver 620 to the filler 500. The receiving protrusion 640 may have a protruding cross-section formed in a quadrangular shape as in FIG. 8. Alternatively, the receiving protrusion 640 may have a protruding cross-section formed in a shape including a polygon such as a triangle or a circle, an 'L' shape, a straight line shape, a hook or zigzag shape. In this case, the filler 500 may include a coupling concave portion 512 corresponding to the shape of the receiving protrusion 640. The coupling concave portion 512 may be formed to correspond to the shape of the receiving protrusion 640 and may be coupled to the receiving protrusion 640. Accordingly, coupling force between the filler 500 and the receiver 600 may be reinforced without a separate adhesive member.

Referring to FIG. 9, in an embodiment, the receiving protrusion 640 of the receiver 600 may protrude between the cover window CW and the filler 500. That is, the receiving protrusion 640 may protrude from the first receiver 610 to the filler 500 and have one side contacting the cover window CW. The other side of the receiving protrusion 640 may have a slope with respect to a vertical direction from the cover window CW. The receiving protrusion 640 may have a protruding cross-section formed in a triangle. The receiving protrusion 640 may be simultaneously coupled to the coupling concave portion 512 of the filler 500 and the cover window CW. Accordingly, coupling force between the receiving protrusion portion 640 and the filler 500, and coupling force between the receiving protrusion portion 640 and the cover window CW may be simultaneously reinforced.

Figure 10:
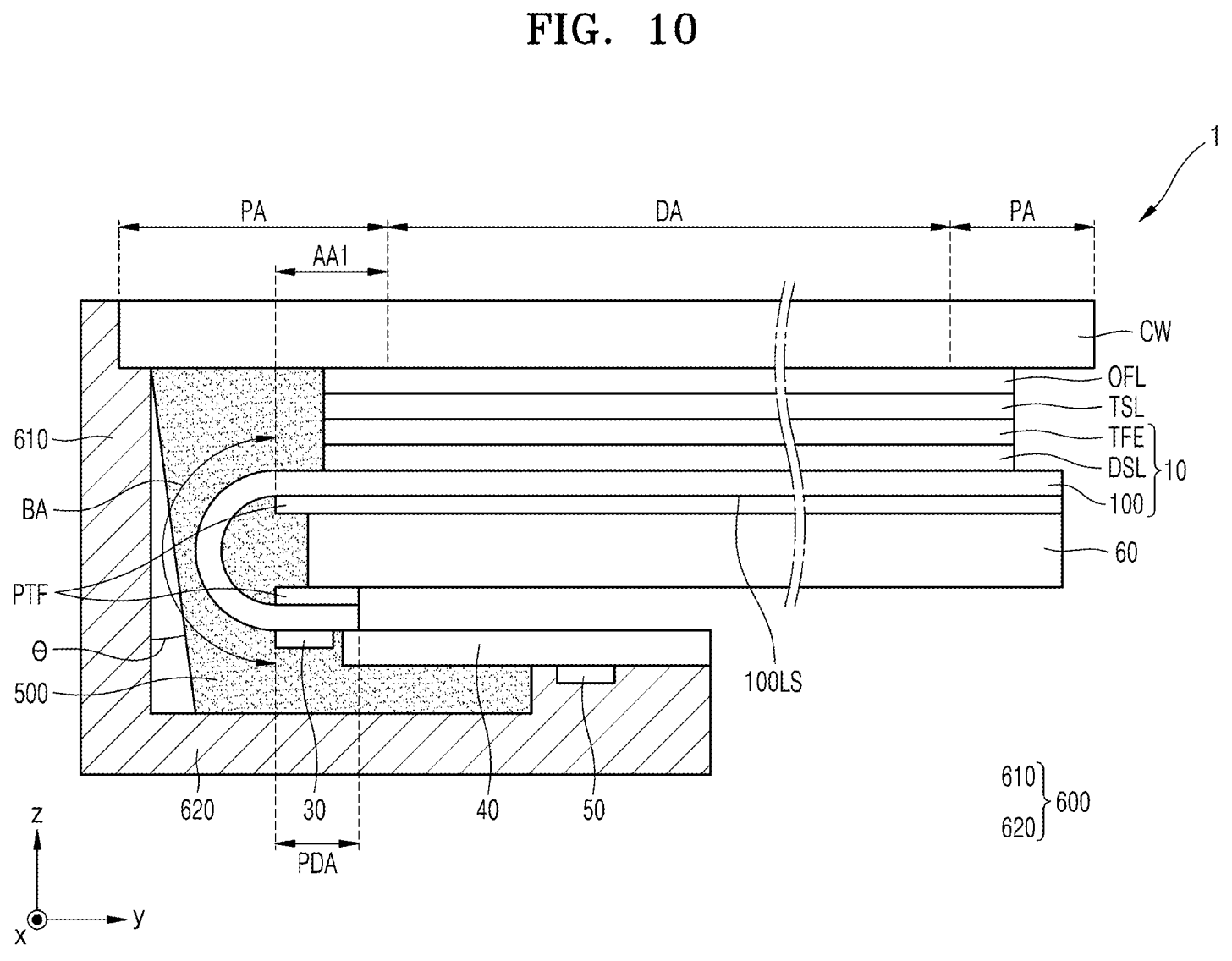

FIG. 10 is a schematic cross-sectional view of the display apparatus 1 according to another embodiment. Because the display apparatus according to an embodiment is similar to the display apparatus described above, differences are mainly described below in detail.

Referring to FIG. 10, in an embodiment, a separation space may be formed between the filler 500 and the receiver 600. Specifically, the first receiver 610 may extend in a vertical direction from the cover window CW. In this case, the filler 500 may have a slope inward with respect to the vertical direction from the cover window CW in the outer space of the bent area BA. In other words, the filler 500 may have a slope toward the center of the display panel 10 in a direction from the cover window CW to the second receiver 620. The filler 500 may have a slope with an angle θ of about 10 to about 2° with respect to a vertical surface of the second receiver 620 (i.e. the z-direction), for example. Accordingly, a separation space may be formed between the first receiver 610 and the filler 500, and the separation space may have a shape gradually increasing in a direction from the cover window CW to the second receiver 620. In the case where the filler 500 is disposed first and then the receiver 600 is disposed, the slope of the filler 500 may allow the receiver 600 to be assembled to the filler 500 more smoothly.

FIGS. 11 to 14 are views showing a method of manufacturing the display apparatus 1 according to an embodiment. A method of manufacturing a display apparatus according to an embodiment may be used to manufacture the display apparatus described above, the embodiment is not limited thereto. Hereinafter, for convenience of description, a method of manufacturing the display apparatus described with reference to FIG. 4 is mainly described below.

Figure 11:
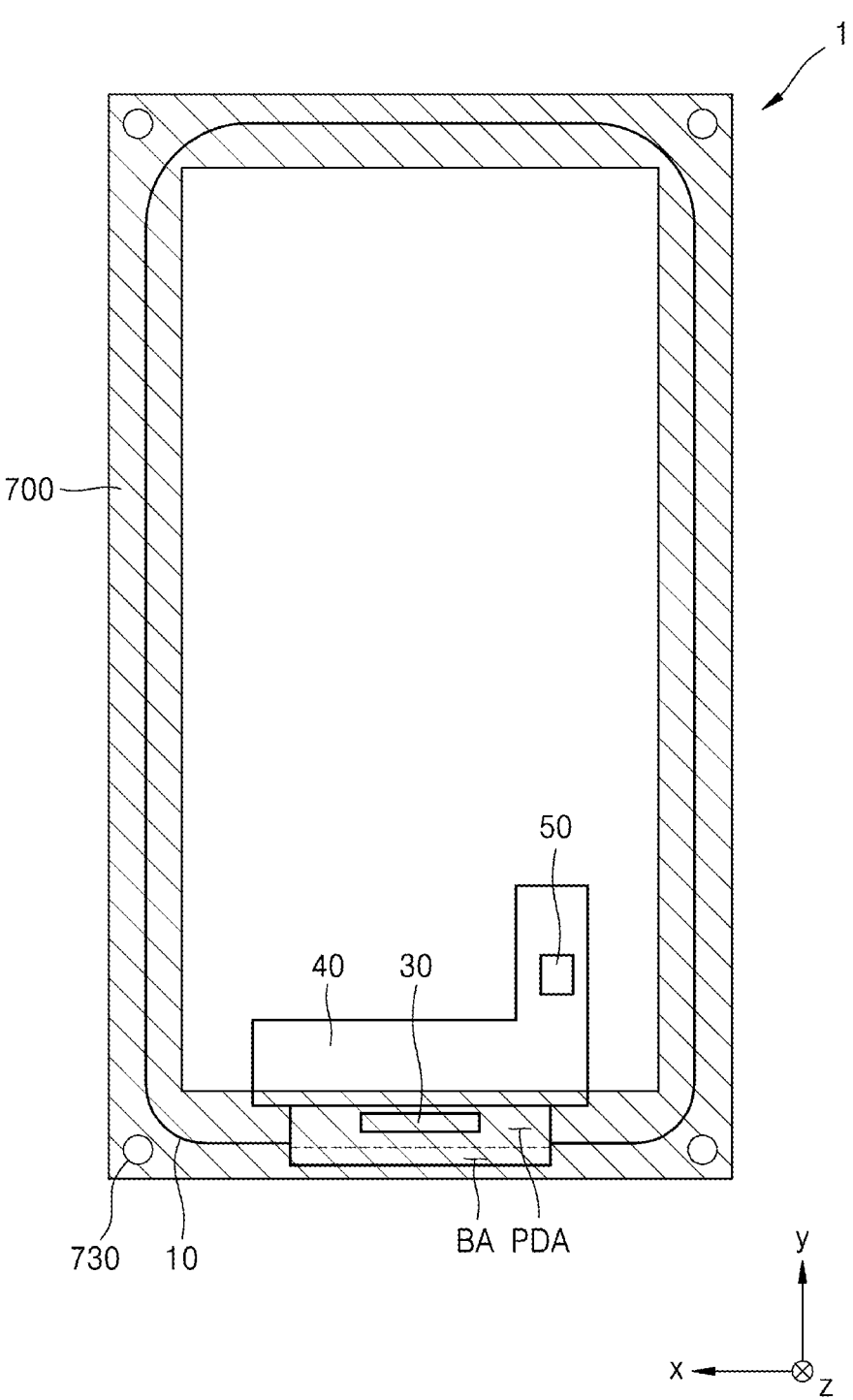
Figure 12:
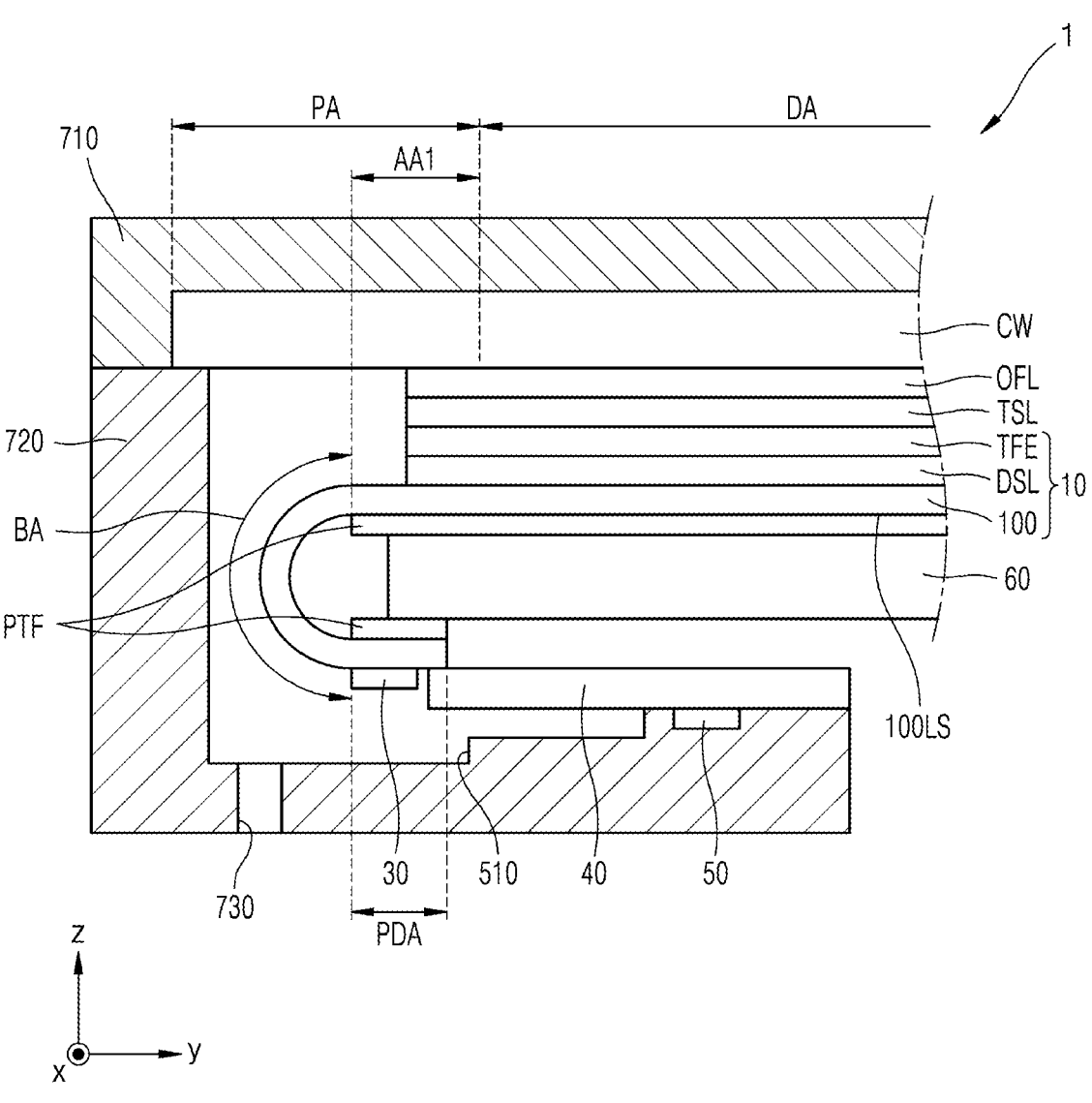

Referring to FIGS. 11 and 12, the display panel 10 may be prepared. The display panel 10 may be bent in the bent area BA and disposed such that the lower surface 100LS of the substrate 100 faces each other. At least one of the touch sensor layer TSL and the optical functional layer OFL may be disposed on the display panel 10. In addition, in the case where at least one of the touch sensor layer TSL and the optical functional layer OFL is disposed, the cover window CW may be disposed thereon.

A mold frame 700 may be disposed on the display panel 10 and the cover window CW. In an embodiment, the mold frame 700 may be arranged the circumference of the display panel 10 and the cover window CW. The mold frame 700 may be arranged along the circumference of the adjacent area AA to be adjacent to the adjacent area AA of the display panel 10. The mold frame 700 may be arranged adjacent to at least one of, for example, the first adjacent area AA1 to the fourth adjacent area AA4. Hereinafter, for convenience of description, the mold frame 700 arranged adjacent to the first adjacent area AA1 is mainly described.

In an embodiment, the mold frame 700 may include a first frame 710 and a second frame 720. However, the embodiment is not limited thereto and the mold frame 700 may be integrally formed. Hereinafter, the case where the mold frame 700 includes the first frame 710 and the second frame 720 is mainly described.

The first frame 710 may be disposed on the cover window CW. The first frame 710 may be formed larger than the cover window CW to cover the cover window CW in a plan view. The second frame 720 may be arranged along the circumference of the cover window CW and the display panel 10. One side of the second frame 720 may be connected to the first frame 710 and another side of the second frame 720 may be connected to the display circuit board 40. Accordingly, the second frame 720 may be disposed to receive a portion of the display panel 10, particularly, the bent area BA. Accordingly, sealing may be formed between the mold frame 700 and the display panel 10. Specifically, because the inner space and the outer space of the bent area BA are sealed by the mold frame 700, a space may be formed inside the mold frame 700.

In an embodiment, a through hole 730 may be formed in the mold frame 700. As described below, the through hole 730 may be a path through which resin for forming the filler 500 is injected. The through hole 730 may be formed, for example, in the second frame 720 to pass through the second frame 720.

Figure 13:
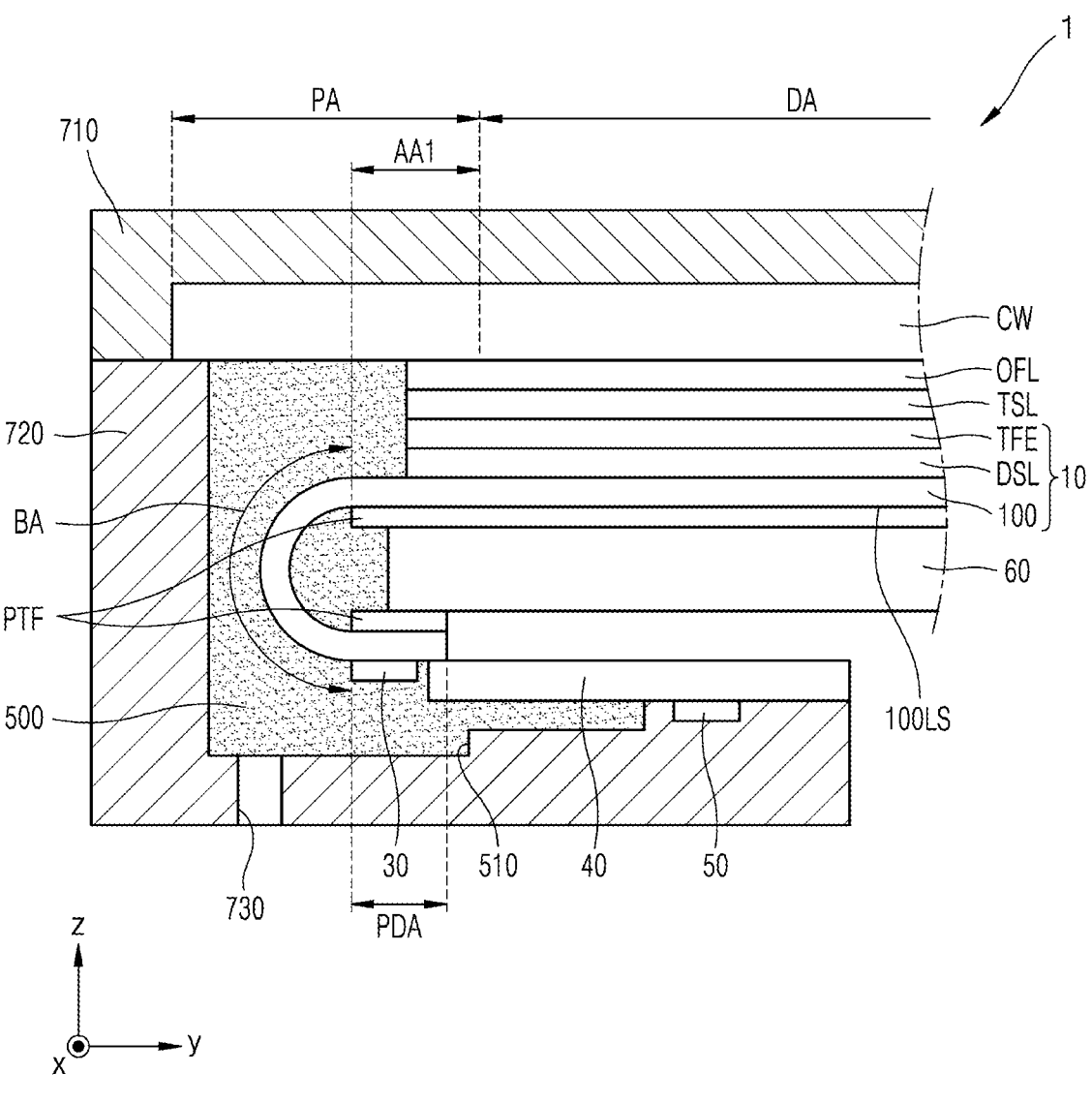

Referring to FIG. 13, the resin may be injected through the through hole 730. The resin may fill a space inside the mold frame 700. Accordingly, both the inner space and the outer space of the bent area BA may be filled with the resin. Because the resin is injected in the form of liquid or gel, the resin may fill the inside of the mold frame 700 to correspond to the inner shape of the mold frame 700. After the resin is injected, the through hole 730 may be closed.

Next, the filled resin may be cured to form the filler 500. In an embodiment, the resin may be cured by irradiating an ultraviolet ray to the resin. Accordingly, the filler 500 may be formed to fill both the inner space and the outer space of the bent area BA to protect the display panel 10, particularly, the bent area BA from external impact. Particularly, the filler 500 is disposed to fill the inner space of the bent area BA to protect the bent area BA, and the filler 500 may fill the space without being affected by a position change of the protective film PTF and the like due to pushing caused by bending of the bent area BA.

In addition, even though the filler 500 has a complicated shape difficult to process, the filler 500 may be easily implemented. Specifically, because the filler 500 is formed by filling the inner space of the mold frame 700 with the resin, the filler 500 may be formed to include, for example, the coupler 510. In this case, the coupler 510 may have a step difference or protrude to have a protruding cross-section formed in an U shape, a straight line, a hook or zigzag shape.

Figure 14:
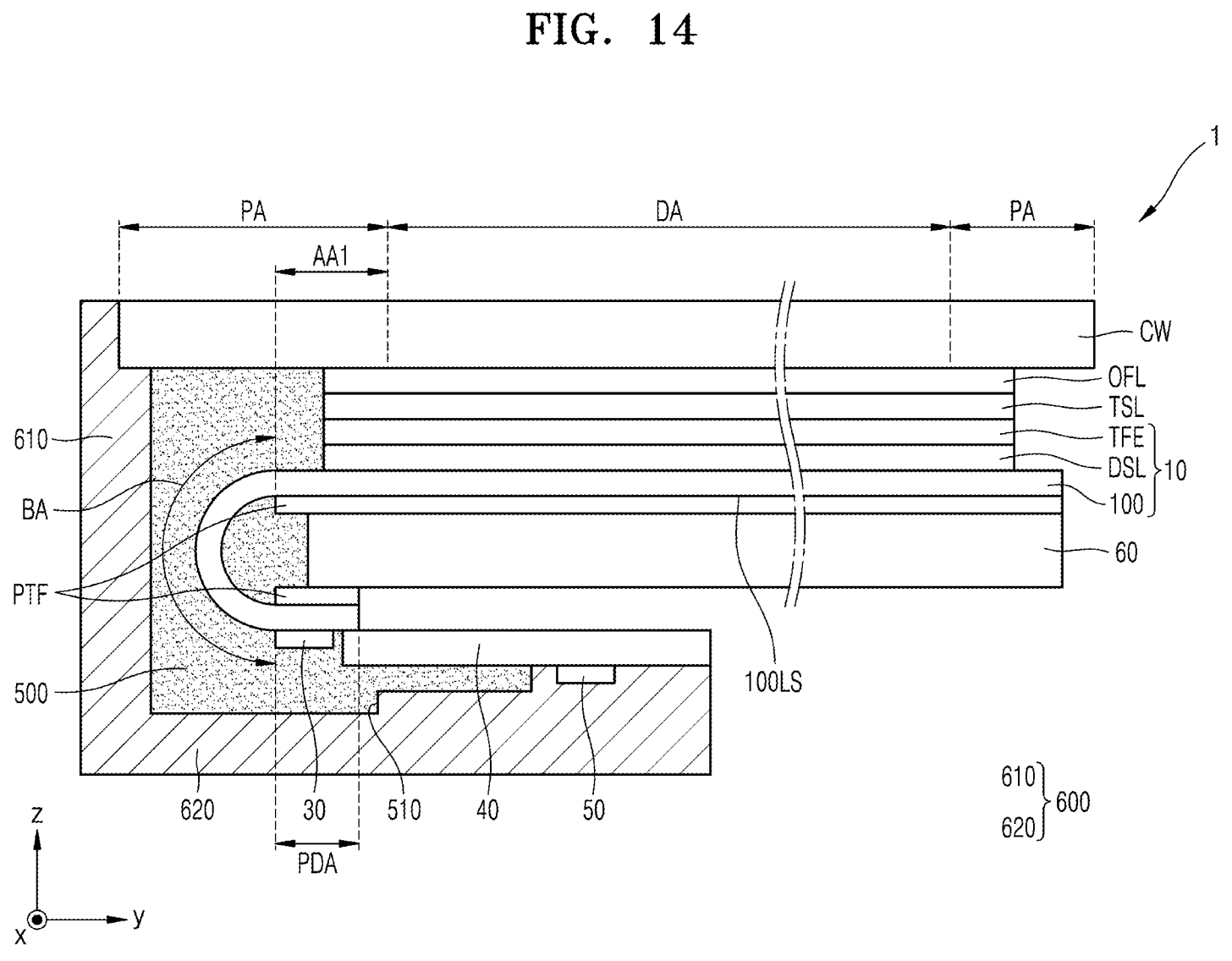

Referring to FIG. 14, the mold frame 700 may be removed and the receiver 600 may be disposed. The receiver 600 may be disposed to surround the filler 500. In an embodiment, the receiver 600 may include the first receiver 610 and the second receiver 620. The first receiver 610 may be a portion of the receiver 600 substantially vertically extending. The second receiver 620 may be a portion of the receiver 600 substantially horizontally extending. That is, an extension direction of the second receiver 620 may be substantially perpendicular to an extension direction of the first receiver 610.

One side of the first receiver 610 may be connected to the circumference of the cover window CW and may perpendicularly extend from the circumference of the cover window CW. Accordingly, the first receiver 610 may be arranged outside the bent area BA. The second receiver 620 may have one side connected to the first receiver 610 and extend horizontally from the first receiver 610. Accordingly, the second receiver 620 may be disposed under the pad area PDA, and another side of the second receiver 620 may be connected to the display circuit board 40.

The receiver 600 may be coupled to the coupler 510 of the filler 500. Accordingly, coupling force between the receiver 600 and the filler 500 may be reinforced without a separate adhesive member.

Figure 15:
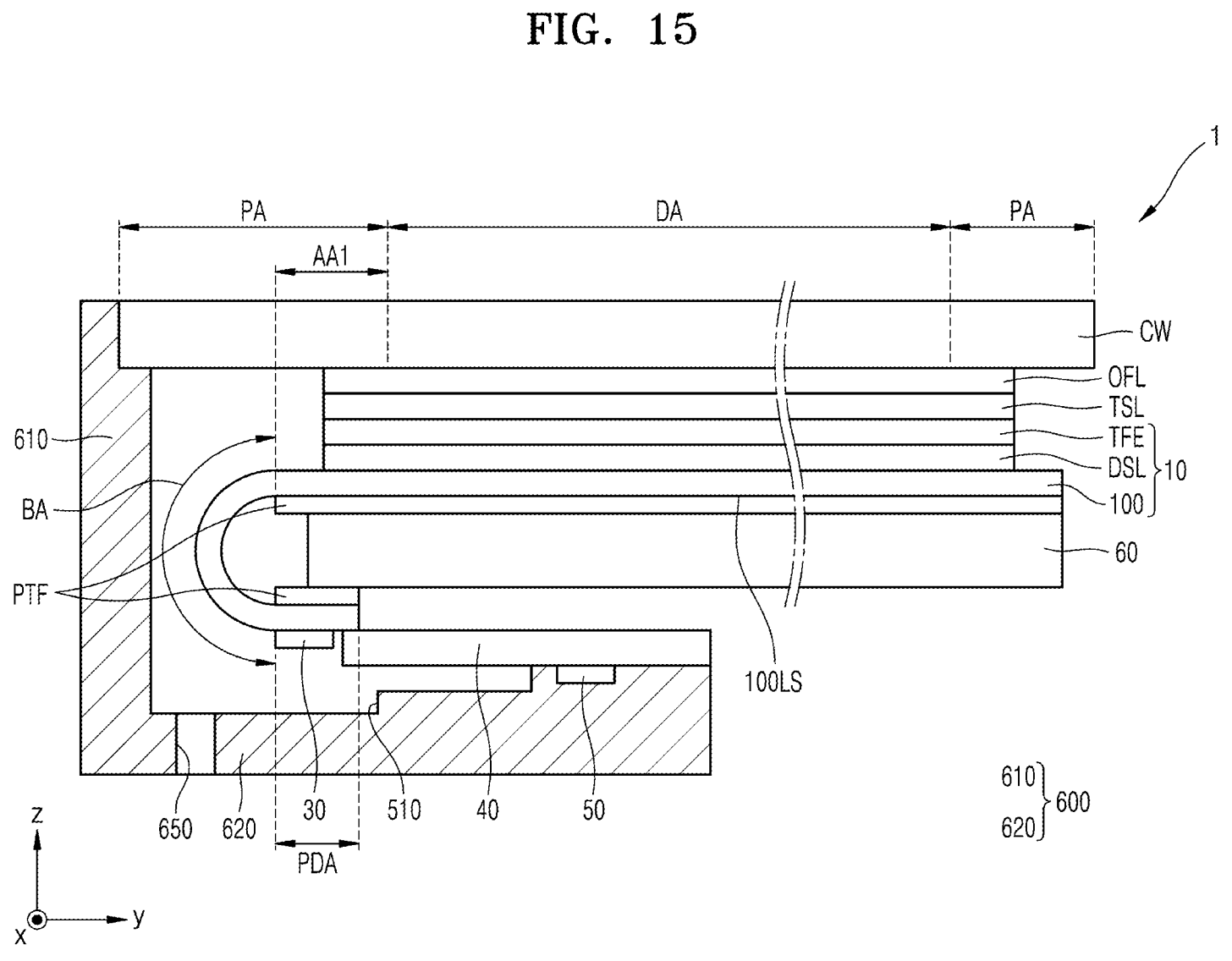

FIG. 15 is a schematic view showing a method of manufacturing the display apparatus according to another embodiment. A method of manufacturing a display apparatus according to another embodiment may be used to manufacture the display apparatus described above, the embodiment is not limited thereto. Hereinafter, for convenience of description, a method of manufacturing the display apparatus described with reference to FIG. 4 is mainly described below.

Referring to FIG. 15, the display panel 10 may be prepared. The display panel 10 may be bent in the bent area BA and disposed such that the lower surface 100LS of the substrate 100 faces each other. At least one of the touch sensor layer TSL and the optical functional layer OFL may be disposed on the display panel 10. In addition, in the case where at least one of the touch sensor layer TSL and the optical functional layer OFL is disposed, the cover window CW may be disposed thereon.

The receiver 600 may be arranged along the circumference of the display panel 10 to receive the display panel 10. Specifically, the receiver 600 may be arranged along the adjacent area AA to be adjacent to the adjacent area AA of the display panel 10. The receive 600 may be arranged to receive, for example, the first adjacent area AA1 to the fourth adjacent area AA4. Alternatively, the receive 600 may be arranged to receive, for example, at least one of the first adjacent area AA1 to the fourth adjacent area AA4. Hereinafter, for convenience of description, the receiver 600 arranged adjacent to the first adjacent area AA1 is mainly described.

In an embodiment, the receiver 600 may include the first receiver 610 and the second receiver 620. The first receiver 610 may be a portion of the receiver 600 substantially vertically extending. The second receiver 620 may be a portion of the receiver 600 substantially horizontally extending. That is, an extension direction of the second receiver 620 may be substantially perpendicular to an extension direction of the first receiver 610.

One side of the first receiver 610 may be connected to the circumference of the cover window CW and may perpendicularly extend from the circumference of the cover window CW. Accordingly, the first receiver 610 may be arranged outside the bent area BA. The second receiver 620 may have one side connected to the first receiver 610 and extend horizontally from the first receiver 610. Accordingly, the second receiver 620 may be disposed under the pad area PDA, and another side of the second receiver 620 may be connected to the display circuit board 40.

Accordingly, a space between the receiver 600, for example, the first receiver 610 and the second receiver 620 and the display panel 10 may be sealed. That is, the inner space and the outer space of the bent area BA may be sealed by the receiver 600. In this case, the receiver 600 may include a through hole 650. As described below, the through hole 650 may be a path through which resin for forming the filler 500 is injected. The through hole 650 may be formed in, for example, the second receiver 620 to pass through the second receiver 620.

Next, resin may be injected through the through hole 650 of the receiver 600. In this case, the receiver 600 may serve as a mold frame and the resin may fill an inner space of the receiver 600. Accordingly, both the inner space and the outer space of the bent area BA may be filled with the resin.

Because the resin is injected in the form of liquid or gel, the resin may fill the inside of the receiver 600 to correspond to the inner shape of the receiver 600. After the resin is injected, the through hole 650 of the receiver 600 may be closed.

Next, as shown in FIG. 4, the filled resin may be cured to form the filler 500. In an embodiment, the resin may be cured by irradiating an ultraviolet ray to the resin. Accordingly, the filler 500 may be formed to fill both the inner space and the outer space of the bent area BA to protect the display panel 10, particularly, the bent area BA from external impact. Particularly, the filler 500 is disposed to fill the inner space of the bent area BA to protect the bent area BA, and the filler 500 may fill the space without being affected by a position change of the protective film PTF and the like due to pushing caused by bending of the bent area BA.

In addition, even though the filler 500 has a complicated shape difficult to process, the filler 500 may be easily implemented. Specifically, because the filler 500 is formed by filling the inner space of the receiver 600 with the resin, the filler 500 may be formed to include, for example, the coupler 510. In this case, the coupler 510 may have a step difference or protrude to have a protruding cross-section formed in an U shape, a straight line, a hook or zigzag shape.

In addition, because the receiver 600 is used as the mold frame without using a separate mold frame, a process is simplified and process costs may be reduced.

According to embodiments, a display apparatus with a reduced area of a peripheral area viewed by a user and a method of manufacturing the display apparatus may be implemented.

Effects of the disclosure are not limited to the above mentioned effects and other effects not mentioned may be clearly understood by those of ordinary skill in the art from the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the scope and spirit as defined by the following claims.

What is claimed is:

1. A display apparatus comprising:
   a display panel including a display area and a peripheral area surrounding the display area, wherein the peripheral area includes a bent area extending from one side of the display area;
   a receiver receiving at least a portion of the display panel; and
   a filler disposed to fill a space between at least a portion of the display panel and the receiver,
   wherein the display area is defined by a first direction crossing a second direction;
   wherein the receiver includes a first receiver portion and a second receiver portion, the first receiver portion extends in a third direction crossing the first direction and the second direction, and the second receiver portion extends in the second direction, and
   wherein the filler includes a coupler disposed in the second receiver portion and having a shape that is directly connected to the second receiver portion.

2. The display apparatus of claim 1, wherein the display panel is bent in the bent area such that lower surfaces thereof face each other, and the filler is disposed to fill a space between the lower surfaces facing each other, and a space between the bent area and the receiver.

3. The display apparatus of claim 1, further comprising a cover window covering the display panel, wherein the receiver is connected to a circumference of the cover window.

4. The display apparatus of claim 3, wherein the filler has a slope toward a center of the display panel in a direction from the cover window to a lower surface of the receiver.

5. The display apparatus of claim 4, wherein the slope of the filler has an angle of about 1° to about 2°.

6. The display apparatus of claim 3, wherein the filler is arranged along the circumference of the cover window.

7. The display apparatus of claim 3, further comprising an optical functional layer disposed between the display panel and the cover window, wherein the filler covers a lateral surface of the optical functional layer.

8. The display apparatus of claim 1, wherein the coupler has a stair-type step difference, and the receiver is coupled to the step difference of the coupler.

9. The display apparatus of claim 1, wherein the coupler includes a coupling protrusion protruding toward the receiver, and the receiver includes a receiving concave portion coupled to the coupling protrusion.

10. The display apparatus of claim 9, wherein the coupling protrusion protrudes in an 'L' shape.

11. The display apparatus of claim 9, wherein the coupling protrusion is provided in plurality, and the plurality of coupling protrusions are arranged apart from each other in an extension direction of the receiver.

12. The display apparatus of claim 1, wherein the receiver includes a receiving protrusion protruding toward the filler, and the coupler includes a coupling concave portion coupled to the receiving protrusion.

13. The display apparatus of claim 12, further comprising a cover window covering the display panel, wherein the receiving protrusion protrudes between the cover window and the filler.

14. An electronic apparatus comprising:

a display apparatus; and a housing receiving the display apparatus and forming an appearance of the electronic apparatus, wherein the display apparatus includes:

a display panel including a display area and a peripheral area surrounding the display area, wherein the peripheral area includes a bent area extending from one side of the display area;

a receiver receiving at least a portion of the display panel; and a filler disposed to fill a space between at least a portion of the display panel and the receiver, wherein the display area is defined by a first direction crossing a second direction;

wherein the receiver includes a first receiver portion and a second receiver portion, the first receiver portion extends in a third direction crossing the first direction and the second direction, and the second receiver portion extends in the second direction, and wherein the filler includes a coupler disposed in the second receiver portion and having a shape that is directly connected to the second receiver portion.

15. The electronic apparatus of claim 14, wherein the display panel is bent in the bent area such that lower surfaces thereof face each other, and the filler is disposed to fill a space between the lower surfaces facing each other, and a space between the bent area and the receiver.

16. The electronic apparatus of claim 14, wherein the coupler has a stair-type step difference, and the receiver is coupled to the step difference of the coupler.

\* \* \* \* \*